(12) United States Patent
Kumamaru

(10) Patent No.: US 8,265,823 B2
(45) Date of Patent: Sep. 11, 2012

(54) SEMICONDUCTOR INTEGRATED CIRCUIT DEVICE, COMMUNICATION DEVICE, INFORMATION REPRODUCING DEVICE, IMAGE DISPLAY DEVICE, ELECTRONIC DEVICE, ELECTRONIC CONTROL DEVICE, AND MOBILE BODY

(75) Inventor: Tomoyuki Kumamaru, Osaka (JP)

(73) Assignee: Panasonic Corporation, Osaka (JP)

( * ) Notice: Subject to any disclaimer, the term of this patent is extended or adjusted under 35 U.S.C. 154(b) by 319 days.

(21) Appl. No.: 12/670,051

(22) PCT Filed: Sep. 22, 2008

(86) PCT No.: PCT/JP2008/002611
§ 371 (c)(1),
(2), (4) Date: Jan. 21, 2010

(87) PCT Pub. No.: WO2009/041010
PCT Pub. Date: Apr. 2, 2009

(65) Prior Publication Data
US 2010/0194468 A1    Aug. 5, 2010

(30) Foreign Application Priority Data

Sep. 27, 2007    (JP) .................................. 2007-250915

(51) Int. Cl.
*G06F 7/00*        (2006.01)
*G05F 1/00*        (2006.01)
(52) U.S. Cl. ......................................... 701/36; 327/535
(58) Field of Classification Search .................... 701/36; 327/81, 118, 192, 203, 204, 206, 208, 214, 327/223, 264, 272, 281, 285, 327, 397–481, 327/537–581; 326/128, 118, 113, 112, 106, 326/102, 51–91
See application file for complete search history.

(56) References Cited

U.S. PATENT DOCUMENTS

| | | | |
|---|---|---|---|
| 5,274,601 A | 12/1993 | Kawahara et al. | |
| 6,316,956 B1 | 11/2001 | Oglesbee | |
| 7,135,748 B2 | 11/2006 | Balakrishnan | |
| 2003/0167112 A1* | 9/2003 | Akiyama | 701/36 |
| 2003/0184364 A1 | 10/2003 | Miyagi | |
| 2006/0006944 A1* | 1/2006 | Matsushita et al. | 330/285 |
| 2007/0042813 A1* | 2/2007 | Ito | 455/573 |
| 2007/0145922 A1* | 6/2007 | Ito et al. | 318/300 |
| 2007/0215952 A1 | 9/2007 | Ozawa et al. | |
| 2007/0258708 A1* | 11/2007 | Ide | 396/89 |
| 2008/0165640 A1* | 7/2008 | Cho | 369/47.15 |

FOREIGN PATENT DOCUMENTS

| | | |
|---|---|---|
| JP | 01-279631 | * 11/1989 |
| JP | 03-094503 | 4/1991 |
| JP | 2007-179345 | 7/2007 |
| JP | 2007-201414 | 8/2007 |

* cited by examiner

*Primary Examiner* — James Trammell
*Assistant Examiner* — Muhammad Shafi
(74) *Attorney, Agent, or Firm* — McDermott Will & Emery LLP

(57) ABSTRACT

In order to suppress an instantaneous carrying current (surge current) and power supply noise caused by the instantaneous carrying current (the surge current), the power supply cutoff structure of a semiconductor integrated circuit device comprises a switching circuit for controlling a power supply to a controlled circuit. The switching circuit includes a plurality of transistors each having a different current capability. The transistors are sequentially provided with a certain regularity, including from a low current capability transistor up to a high current capability transistor.

24 Claims, 19 Drawing Sheets

F I G. 6
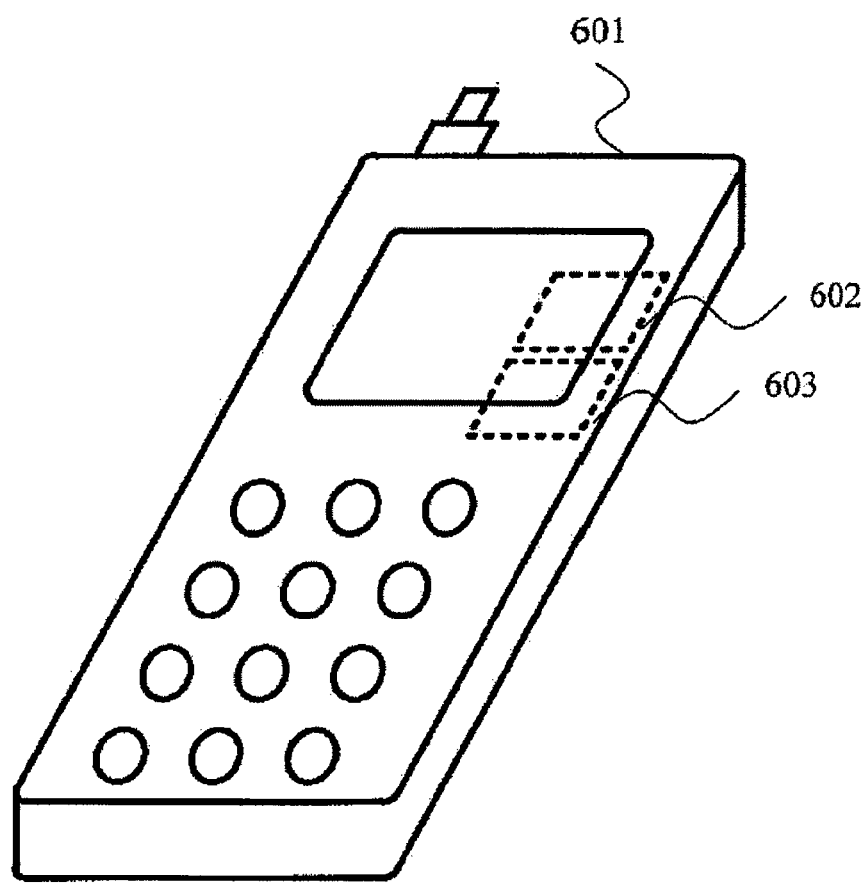

F I G. 8
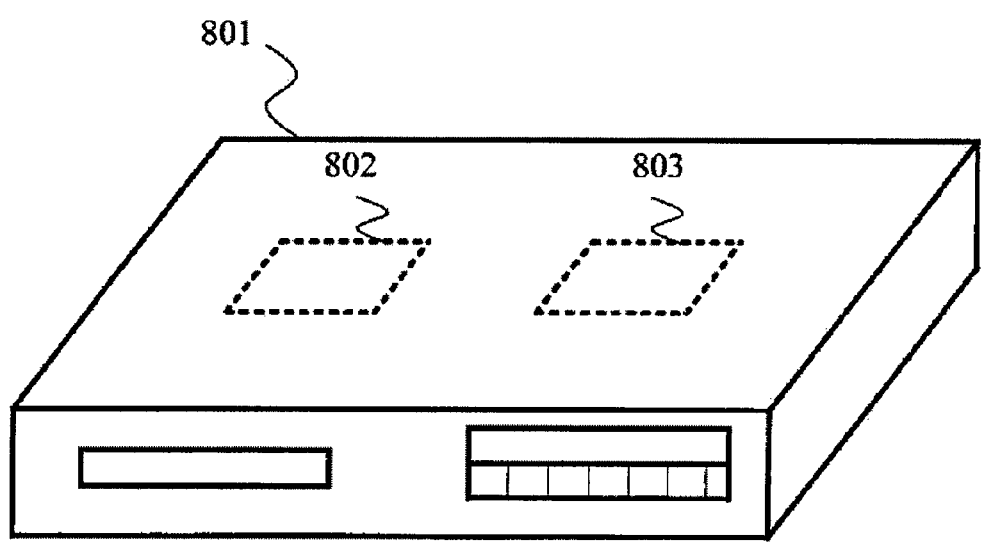

F I G. 1 0
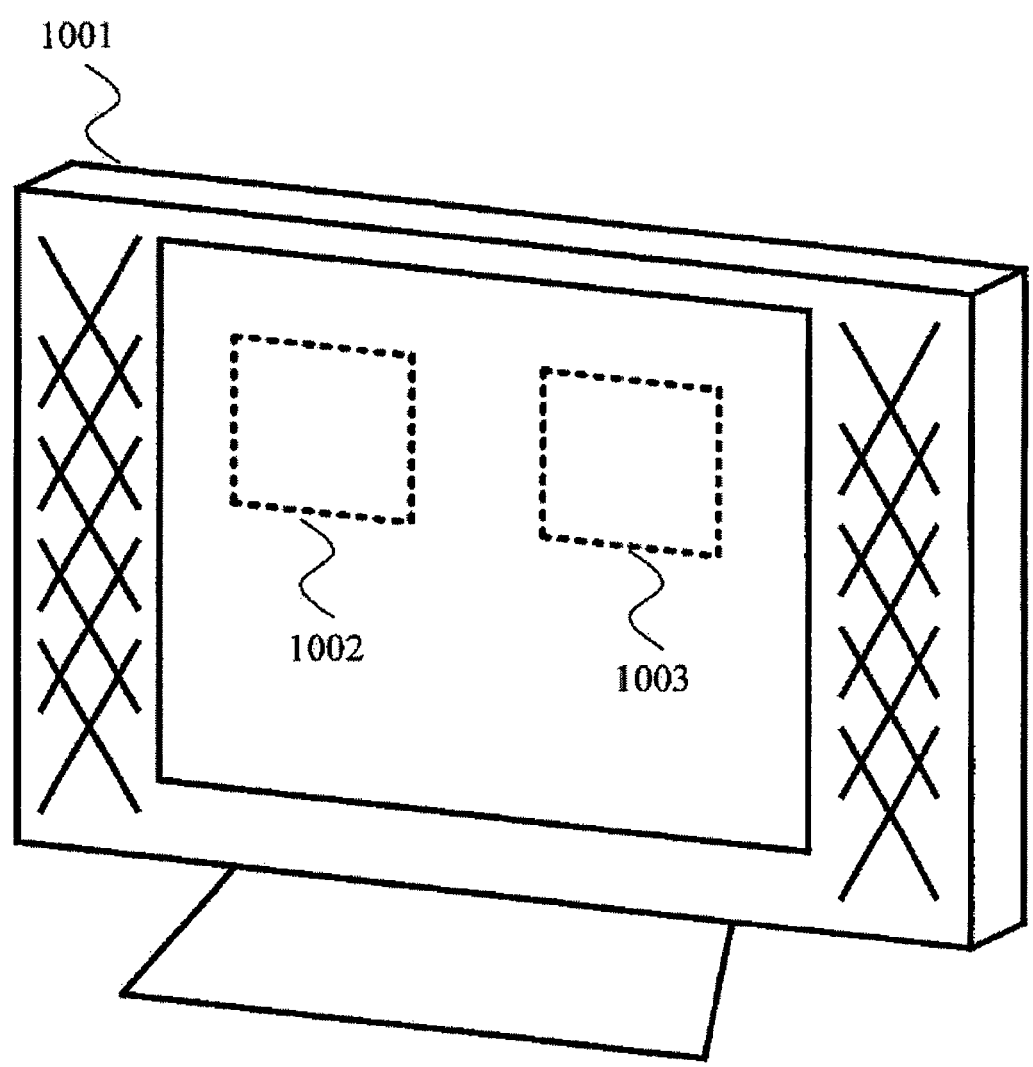

F I G. 1 2
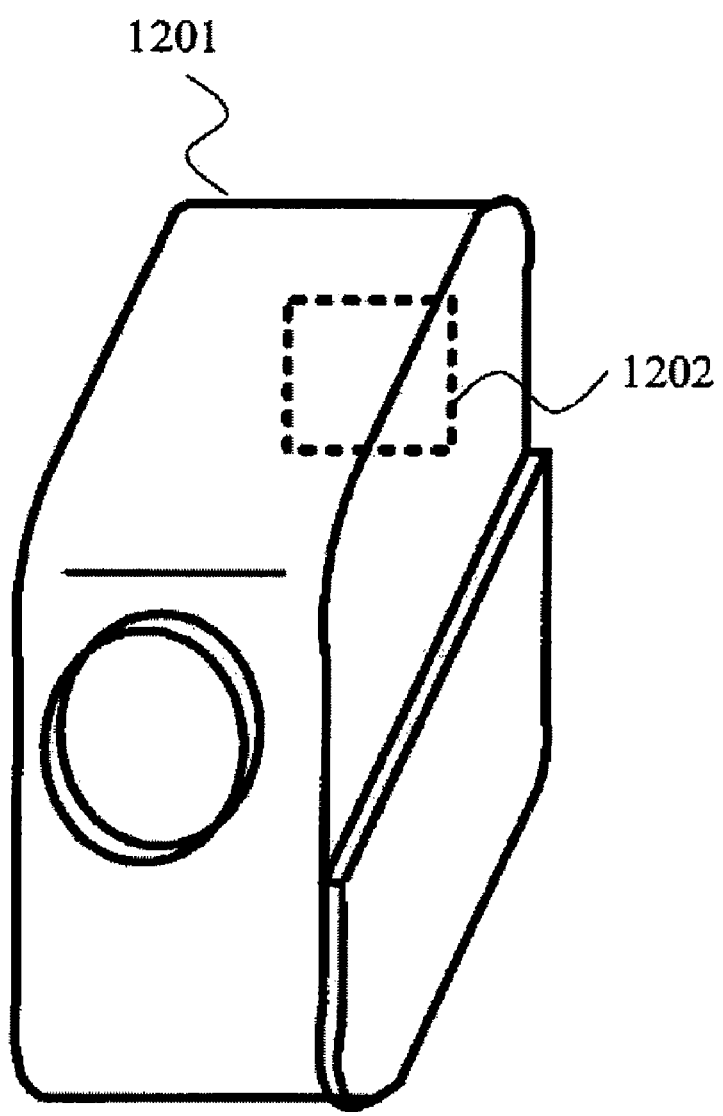

SEMICONDUCTOR INTEGRATED CIRCUIT DEVICE, COMMUNICATION DEVICE, INFORMATION REPRODUCING DEVICE, IMAGE DISPLAY DEVICE, ELECTRONIC DEVICE, ELECTRONIC CONTROL DEVICE, AND MOBILE BODY

RELATED APPLICATIONS

This application is the U.S. National Phase under 35 U.S.C. §371 of International Application No. PCT/JP2008/002611, filed on Sep. 22, 2008, which in turn claims the benefit of Japanese Application No. 2007-250915, filed on Sep. 27, 2007, the disclosures of which Applications are incorporated by reference herein.

FIELD OF THE INVENTION

The present invention relates to a power cutoff technology and a source bias control technology aimed at reducing power consumption in a semiconductor circuit.

BACKGROUND OF THE INVENTION

FIG. 16 is an illustration of a conventional power cutoff technology. A controlled circuit 1601 is connected to a power source 1604 and a pseudo ground 1606. In a switch circuit location area 1603, a switch circuit 1602 comprising one or a plurality of transistors is provided between the pseudo ground 1606 and a ground 1605. In the transistors, gates, drains and sources thereof are connected in the same manner. All of the gates of the transistors are connected to a control signal input terminal 1607, and control signals for power control are supplied from a semiconductor integrated circuit to the control signal input terminal 1607.

When the controlled circuit 1601 is operating, a control signal for turning on the switch circuit 1602 is inputted to the control signal input terminal 1607. The input of the control signal renders the pseudo ground 1606 and the ground 1605 short-circuited, and the controlled circuit 1601 correspondingly carries out a normal operation. On the contrary, a control signal for turning off the switch circuit 1602 is inputted to the control signal input terminal 1607 when the controlled circuit 1601 is not operating. As a result, the connection between the pseudo ground 1606 and the ground 1605 is blocked. A potential of the pseudo ground 1606, when power is cut off, rises to a point at which a halt-time leak current of the controlled circuit 1601 and a leak current of the switch circuit 1602 come into balance with each other. According to the power control configured to cut off power while the controlled circuit 1601 is not operating, the leak current can be significantly lessened as compared with any other power control methods wherein the power cutoff is not implemented during the non-operating state.

As so far described, the leak current can be lessened by employing the power cutoff technology wherein power is cut off selectively in any block which is not used for circuit operations and data retention. Therefore, the technology effectively contributes to the reduction of power consumption in LSI. The power cutoff technology thus advantageous, however, includes such a problem as the occurrence of an instantaneous carrying current. Below is described the problem. FIG. 17 is a drawing briefly describing the instantaneous carrying current produced in the power cutoff technology.

In the power cut-off state, the voltage of the pseudo ground 1606 rises and reaches a voltage level 1701. the voltage of the pseudo ground 1606, however, takes a sudden drop to a voltage level 1702 when the switch circuit 1602 is turned on and moves to a power supplied state. Then, charges stored in the controlled circuit 1601 are drawn out in the direction of the ground 1605 through the switch circuit 1602, making a large instantaneous carrying current 1705 flow. A leak current 1703 in the power cut-off state flows before the occurrence of the instantaneous carrying current 1705, while a leak current 1704 in the power supplied state flows after the occurrence of the instantaneous carrying current 1705. The leak current 1704 is larger than the leak current 1703.

The flow of the instantaneous carrying current 1705 causes IR-Drop owing to parasitic resistance, and a potential of the ground 1605 correspondingly undergoes noises. When this non-operating circuit block is connected to an operating circuit block by way of the ground 1605, the noises generated in this non-operating circuit block are transmitted to the operating circuit block. The transmission of the noises may cause a malfunction.

Various technical ideas have been proposed in order to solve the problem of the instantaneous carrying current. FIG. 18 is a brief illustration of a first technical idea recited in Patent Document 1, which is described below. A current monitor circuit 1809 is provided between a controlled circuit 1801 and a switch circuit location area 1802. To the switch circuit 1802 is inputted a signal outputted from a power cutoff switch control circuit 1808 in place of a control signal from the LSI side. At that time, the power cutoff switch control circuit 1808 decides a signal to be outputted to the switch circuit 1082 based on a signal transmitted from the current monitor circuit 1809. According to the device thus constituted, a current flowing in the switch circuit 1802 is restrained from exceeding a predetermined current value.

The first technical idea, however, requires the power cutoff switch control circuit 1808 and the current monitor circuit 1809, and a control system provided with these circuits has a complicated configuration. The location of the current monitor circuit 1809 demands such a design that is capable of dealing with the occurrence of, for example, parasitic resistance so that the current monitor circuit 1809 will not impact the controlled circuit 1801. As described, the first technical idea fails to come up with an easy solution for the problem of instantaneous carrying current.

FIG. 19 is a brief illustration of a second technical idea recited in Patent Document 2, which is described below. According to the second technical idea, each substrate node of a switch circuit 1902 is connected to a substrate bias control circuit 1908. The instantaneous carrying current flow is produced in the transition of a power cut-off state to a power supplied state. At this time, a reverse substrate bias outputted from the substrate bias control circuit 1908 is applied to the switch circuit 1902. As a result, a current capability of the switch circuit 1092 is reduced, which leads to the reduction of the instantaneous carrying current.

However, the second technical idea based on the control of the current capability of the switch circuit 1902 through the bias control can only exert a limited effect, thereby failing to provide an ultimate solution for the instantaneous carrying current.

Patent Document 3 relates to an output circuit and deals with a different subject and a different purpose. The device recited therein drives circuits having different current capacities in a time-shifting manner. When the technical idea is implemented in the power cutoff technology, the instantaneous carrying current may be reduced to a certain extent. However, it is still unlikely to reduce the instantaneous carrying current effectively enough to eradicate the risk of a circuit malfunction.

Patent Document 1: 2007-179345 of the Japanese Patent Applications Laid-Open
Patent Document 2: 2007-201414 of the Japanese Patent Applications Laid-Open
Patent Document 1: H01-279631 of the Japanese Patent Applications Laid-Open

DISCLOSURE OF THE INVENTION

Problem to be Solved by the Invention

As described earlier, the conventional power cutoff technology was an effective method for reducing the leak current in LSI; however, had the problem of instantaneous carrying current. As described above, several countermeasures were proposed solve the problem of instantaneous carrying current, but none of them can be effective enough for the following reasons: a practical use is difficult due to its complicated circuit configuration, or some effect may be expected but an ultimate solution is not provided.

Means for Solving the Problem

In order to solve the conventional problem, a semiconductor integrated circuit device according to the present invention comprises a switch circuit for controlling power supply to a controlled circuit, wherein the switch circuit comprises a plurality of transistors respectively having different current capabilities, and the transistors are sequentially provided in accordance with small to large current capabilities thereof based on an ordinal criterion.

According to a mode of the present invention, the semiconductor integrated circuit device further comprises a controller for controlling the switch circuit, wherein the plurality of transistors are connected in parallel to the controlled circuit, and the controller imparts the ordinal criterion to the transistors by sequentially controlling conduction of the transistors in the order of the current capabilities thereof.

According to another mode of the present invention, the controller makes the plurality of transistors at anon-conducted state sequentially change from the non-conducted state to a conducted state at certain time intervals, starting with the transistor having a smallest current capability and finishing with the transistor having a largest capability.

According to still another mode of the present invention, the current capabilities of the transistors are set so that a variation of a power source potential occurring in the controlled circuit at the time of the transition of the transistors to a conducted state can be constant.

According to still another mode of the present invention, the controller makes the plurality of transistors at a conducted state sequentially change from the conducted state to a non-conducted state at certain time intervals, starting with the transistor having a largest current capability and finishing with the transistor having a smallest capability.

According to still another mode of the present invention, the current capabilities of the transistors are set so that a variation of a power source potential occurring in the controlled circuit at the time of the transition of the transistors to a non-conducted state can be constant.

According to still another mode of the present invention, the controller further comprises a delay circuit for delaying a control signal produced based on a reference clock, wherein the controller sequentially controls the conduction of the transistors in the order of the current capabilities thereof at certain time intervals determined by combinations of outputs of the delay circuit and the control signal.

According to still another mode of the present invention, a plurality of the delay circuits are provided so as to correspond to the transistors, the delay circuits being connected in series to one another, output terminals of the delay circuits are each connected to bases of the transistors corresponding thereto, and the delay circuits each delay the control signal inputted to the delay circuit positioned first in an alignment of the delay circuits in accordance with a position thereof in the alignment, and supply the delayed control signal to the base of the transistor corresponding thereto.

According to still another mode of the present invention, the controller sequentially controls the conduction of the transistors in the order of the current capabilities thereof at certain time intervals determined by a control signal produced based on a reference clock.

According to still another mode of the present invention, the controller further comprises a control signal supply source, wherein the control signal supply source produces, based on the reference clock, the control signal whose output is converted at the certain time intervals in correspondence with each of the transistors, and supplies the resulting control signals to the bases of the transistors.

According to still another mode of the present invention, the controller determines the certain time intervals based on combinations of the single control signal and the plurality of the delay circuits.

According to still another mode of the present invention, the controller comprises:
a plurality of delay circuit units; and
a control signal supply source for producing the control signal specific to each of the delay circuit units and supplying the produced control signals to the delay circuit units, wherein
the delay circuit units each comprise a plurality of delay circuits connected in series to one another, and
the control signal supply source produces the control signals time-shifted relative to each other by a time equivalent to a largest delay time in each of the delay circuit units, and supplies the produced control signals to the delay circuit units.

According to still another mode of the present invention, the semiconductor integrated circuit devices further comprises a source bias control circuit for controlling a source bias of the controlled circuit, wherein
the controller makes the plurality of transistors at a non-conducted state sequentially change from the non-conducted state to a conducted state at certain time intervals, starting with the transistor having a smallest current capability and finishing with the transistor having a largest capability, when the source bias control circuit shifts from a source bias controlled state to a source bias released state, and
the controller makes the plurality of transistors at a conducted state sequentially change from the conducted state to a non-conducted state at certain time intervals, starting with the transistor having the largest current capability and finishing with the transistor having the smallest capability, when the source bias control circuit shifts from the source bias released state to the source bias controlled state.

According to still another mode of the present invention, the controlled circuit comprises a high voltage side power source and a low voltage side power source, wherein the transistors control the power supply to the controlled circuit by the high voltage side power source.

According to still another mode of the present invention, the controlled circuit comprises a high voltage side power source and a low voltage side power source, wherein the transistors control the power supply to the controlled circuit by the low voltage side power source.

A communication device according to the present invention comprises:

the semiconductor integrated circuit device according to the present invention;

a high-frequency transmission/reception interface unit connected to the semiconductor integrated circuit device; and an external input interface unit connected to the semiconductor integrated circuit device, wherein the controller controls the switch circuit based on an electrical signal received by the semiconductor integrated circuit device by way of the high-frequency transmission/reception interface unit or the external input interface unit.

An information reproducing device according to the present invention comprises:

the semiconductor integrated circuit device according to the present invention;

a tuner connected to the semiconductor integrated circuit device; and an interface unit connected to the semiconductor integrated circuit device, wherein the controller controls the switch circuit based on an electrical signal received by the semiconductor integrated circuit device by way of the tuner or the interface unit.

An image display device according to the present invention comprises:

the semiconductor integrated circuit device according to the present invention;

a network interface unit connected to the semiconductor integrated circuit device; and an external input interface unit connected to the semiconductor integrated circuit device, wherein the controller controls the switch circuit based on an electrical signal received by the semiconductor integrated circuit device by way of the network interface unit or the external input interface unit.

An electronic device according to the present invention comprises:

the semiconductor integrated circuit device according to the present invention;

a CCD interface unit connected to the semiconductor integrated circuit device; and an external input interface unit connected to the semiconductor integrated circuit device, wherein the controller controls the switch circuit based on an electrical signal received by the semiconductor integrated circuit device by way of the CCD interface unit or the external input interface unit.

An electronic control device according to the present invention comprises:

the semiconductor integrated circuit device according to the present invention; and a navigation interface unit connected to the semiconductor integrated circuit device, wherein the controller controls the switch circuit based on an electrical signal received by the semiconductor integrated circuit device by way of the navigation interface unit.

A mobile body according to the present invention comprises:

the electronic control device according to the present invention; and an engine transmission interface unit connected to the semiconductor integrated circuit device, wherein the controller controls the switch circuit based on an electrical signal received by the semiconductor integrated circuit device by way of the navigation interface unit or the engine transmission interface unit.

Effect of the Invention

The present invention can control an instantaneous carrying current which causes a serious problem in developing the power cutoff technology to effectively reduce a leak current in LSI, and successfully prevents power source noises caused by the instantaneous carrying current and resultant circuit malfunctions from occurring.

The present invention can also avoid the risk of any damage to data retained in the controlled circuit when the source bias is controlled, because of the following advantages:

the present invention can be applied to the source bias control technology for reducing a leak current by controlling the source bias of the controlled circuit; and the present invention can control a sharp up-and-down variation of a source potential during the transition between the source bias control and the source bias release.

As thus far described, the present invention can remove the existing bottleneck of the technology for reducing power consumption in LSI. Therefore, power consumption in LSI can be effectively reduced.

FIG. 6 is a schematic illustration of a communication device comprising a semiconductor integrated circuit device according to the present invention.

FIG. 8 is a schematic illustration of an information reproducing device comprising the semiconductor integrated circuit device according to the present invention.

FIG. 10 is a schematic illustration of an image display device comprising the semiconductor integrated circuit device according to the present invention.

FIG. 12 is a schematic illustration of an electronic device comprising the semiconductor integrated circuit device according to the present invention.

Figure 1:
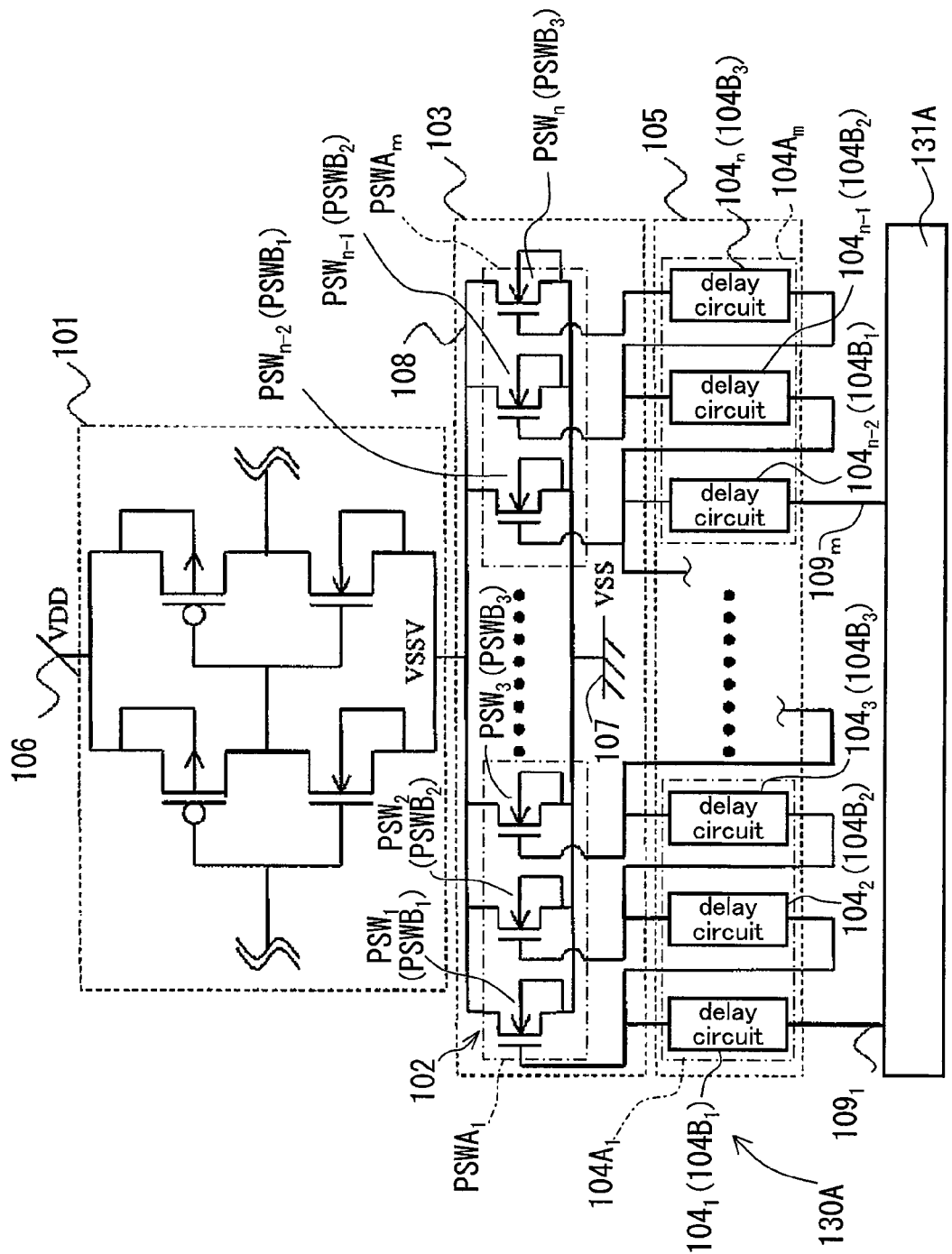
FIG. 1 is a circuit diagram illustrating a preferred embodiment 1 of the present invention.

DESCRIPTION OF REFERENCE SYMBOLS 101 controlled circuit
102 switch circuit
103 switch circuit location area
$104_{1-n}$ delay circuit
$104A_{1-m}$ delay circuit unit
$104B_{1-i}$ delay circuit
$PSW_{1-n}$ transistor
$PSWA_{1-m}$ transistor unit
$PSWB_{1-i}$ transistor
105 delay circuit location area
106 power source
107 ground
108 pseudo ground
$109_{1-m}$ control signal input terminal
130A controller
130B controller
130C controller
131A control signal supply source
131B control signal supply source
201 pseudo ground voltage value at a power cutoff time
202 pseudo ground voltage value at a power supplied time
203 pseudo ground current value at a power cutoff time
204 pseudo ground current value at a power supplied time
205 instantaneous carrying current
510 source bias control circuit
601 mobile telephone
602 base band LSI
603 application LSI
801 optical disc device
802 media signal processing LSI
803 error correction/servo processing LSI
1001 television receiver
1002 image/audio processing LSI
1003 display/sound source control LSI
1201 digital camera
1202 signal processing LSI
1401 automobile
1402 electronic control device
1403 engine/transmission control LSI
1404 navigation device
1405 LSI for navigation
1501 high-frequency transmission/reception interface unit
1502 external input interface unit
1503 interface unit
1504 tuner
1505 network interface unit
1506 external input interface unit
1507 external input interface unit
1508 CCD interface unit
1509 engine/transmission interface unit
1510 navigation interface unit

PREFERRED EMBODIMENTS OF THE PRESENT INVENTION

Preferred Embodiment 1

FIG. 1 is an illustration of a preferred embodiment 1 of the present invention. A semiconductor integrated circuit device according to the present preferred embodiment comprises a controlled circuit 101, a switch circuit location area 103, and a delay circuit location area 105. The controlled circuit 101 is connected to a power source 106 and a pseudo ground 108, and a switch circuit 102 is provided in the switch circuit location area 103. The switch circuit 102 comprises a plurality of transistors $PSW_{1-n}$ (n is the total number of transistors) having the function of controlling the supply and cutoff of power. The transistors $PSW_{1-n}$ each have their current capabilities successively different to one another. More specifically, the switch circuit location area 103 is provided with the switch circuit 102 comprising the plurality of transistors, ranging from a transistor $PSW_1$ having a smallest current capability to a transistor $PSW_n$ having a largest current capability. The transistors $PSW_{1-n}$ are provided based on such an ordinal criterion that they are placed in juxtaposition in the switch circuit location area 103 in the order of the current capabilities thereof. The transistors $PSW_{1-n}$ are placed in juxtaposition between the pseudo ground 108 and the ground 107. In all of the transistors $PSW_{1-n}$, drains thereof are connected to the pseudo ground 108, and sources and substrates thereof are connected to the ground 107.

In the delay circuit location area 105, delay circuits $104_{1-n}$ as many as the transistors $PSW_{1-n}$ are provided. The delay circuits $104_{1-n}$ have their characteristics adjusted such that they all have the same delay value. The delay circuits $104_{1-n}$ are grouped into a plurality of first-mth delay circuit units $104A_{1-m}$ (m is the total number of delay circuit units). The first delay circuit unit $104A_1$ is positioned first and the mth delay circuit unit $104A_m$ is positioned last in the direction of the circuit connection. A plurality of delay circuits $104B_{1-i}$ (i=3 in FIG. 1) constitute the first-mth delay circuit units $104A_{1-m}$. In the delay circuit units $104A_{1-m}$, the delay circuits $104B_{1-i}$ constituting individual units are connected in series to one another. More specifically, input terminals and output terminals thereof are coupled with one another so as to form a chain shape. The output terminals of the delay circuits $104_{1-n}$ are connected to gates of the transistors $PSW_{1-n}$ which are provided to correspond to the delay circuits $104_{1-n}$. In the description of the present preferred embodiment, two different reference symbols are given to the same delay circuit: serially-numbered reference symbols $104_{1-n}$ in all of the delay circuits 104, and serially-numbered reference symbols $104B_{1-i}$ in first-mth delay circuit units $104A_{1-m}$.

The semiconductor integrated circuit device according to the present preferred embodiment further comprises a control signal supply source 131A for producing control signals specific to the first-mth delay circuit units $104A_{1-m}$ based on a reference clock of LSI and supplying the produced control signals to the first-mth delay circuit units $104A_{1-m}$. In the present preferred embodiment, the control signal supply source 131A and the delay circuits $104_{1-n}$ constitute a controller 130A.

The transistors $PSW_{1-n}$ thus connected to the delay circuits $104_1$, are grouped into a plurality of first-mth transistor units $PSWA_{1-m}$ (m is a total number of transistors) as in the case of the delay circuits $104_{1-n}$. A plurality of transistors $PSWB_{1-i}$ (i=3 in FIG. 1) constitute the first-mth transistor units $PSWA_{1-m}$.

Moreover, first-mth control signal input terminals $109_{1-m}$ are provided so as to correspond to the first-mth delay circuit units $104A_{1-m}$. Control signals produced by the control signal supply source 131A are inputted to the first-mth control signal input terminals $109_{1-m}$. An xth control signal input terminal $109_x$ is connected to the delay circuit $104B_1$ positioned first in the direction of the circuit connection in an xth delay circuit unit $104A_x$ corresponding thereto (x is an arbitrary natural number between 1 and m). Therefore, the control signal inputted to the xth control signal input terminal $109_x$ is inputted to the delay circuit $104B_1$ positioned first in the direction of the circuit connection in the xth delay circuit unit $104A_x$, and thereafter transmitted inside the xth delay circuit unit $104A_x$ while being successively delayed by the delay circuits $104B_{1-i}$ constituting the xth delay circuit unit $104Ax$. Then, the resulting control signals are outputted from the delay circuits $104B_{1-i}$ and supplied to the gates of the transistors $PSWB_{1-i}$ corresponding to the delay circuits $104B_{1-i}$.

The connection between the delay circuits $104_{1-n}$ and the transistors $PSW_{1-n}$ is configured to implement the conduction order in which the transistor $PSW_1$ having the smallest current capability is the first transistor to be conducted, and the transistors $PSW_{1-n}$ are sequentially conducted in increasing order of current capability, and then, the transistor $PSW_n$ having the largest current capability is finally conducted.

More specifically, in the case of an arbitrary yth delay circuit unit $104k$ and a yth transistor unit $PSWA_y$ corresponding to the yth delay circuit unit $104A_y$ (y is a natural number between 1 and m), for example, the connection is configured as follows:

the delay circuit $104B_1$ positioned first in the direction of the circuit connection in the yth delay circuit unit $104A_y$ is connected to the transistor $PSWB_1$ having the smallest current capability in the yth transistor unit $PSWA_y$;

the delay circuit $104B_2$ positioned next in the direction of the circuit connection is connected to the transistor $PSWB_2$ having the second smallest current capability in the yth transistor unit $PSWA_y$; and the delay circuit $104B_i$ positioned last in the direction of the circuit connection is connected to the transistor $PSWB_i$ having the largest current capability in the yth transistor unit $PSWA_y$.

Thus, the connection between the yth delay circuit unit $104A_y$ and the yth transistor unit $PSWA_y$ is configured so that the delay circuits $104B_{1-i}$ constituting the yth delay circuit unit $104A_y$ are sequentially connected in the descending order of the current capabilities thereof in the direction of the circuit connection and the transistors $PSWB_{1-i}$ constituting the yth transistor unit $PSWA_y$ are sequentially connected in the ascending order of the current capabilities thereof.

In order to implement the conduction order described earlier in the transistors $PSW_{1-n}$, in addition to the connection between the transistors $PSW_{1-n}$ and the delay circuits $104_{1-n}$ configured as described, the control signals to be supplied by the control signal supply source 130A to the first-mth control signal input terminals $109_{1-m}$ are controlled as follows.

Provided that the control signals supplied to a pth delay circuit unit $104A_p$ and a p+1th delay circuit unit $104A_{p+1}$ adjacent to each other (p is an arbitrary natural number between 1 and m−1) are a pth control signal and a p+1 control signal, respectively, and an amount of time by which the control signal is delayed by the delay circuits $104_1$, is a delay time T, a difference df between a timing $TM_p$ at which the pth control signal is supplied to the delay circuit unit $104A_p$ and a timing $TM_{p+1}$ at which the p+1th control signal is supplied to the p+1th delay circuit unit $104A_{p+1}$ is set to a time length obtained by adding an allowance time a to a total delay time Txi of the delay circuits $104B_{1-i}$ constituting the pth delay circuit unit $104A_p$ (df=Txi+α).

In the case of the semiconductor integrated circuit device according to the present preferred embodiment thus constituted, when a return to a power supplied state from a power cutoff state takes place, at first, a first control signal for turning on the transistors $PSWB_{1-i}$ of the first transistor unit $PSWA_1$ is supplied from the control signal supply source 131A to the control signal input terminal $109_1$ connected to the first delay circuit unit $104A_1$ positioned first in the direction of the circuit connection. Upon the supply of the first control signal, the transistors $PSWB_{1-i}$, from the transistor $PSWB_1$ having the smallest current capability to start with, are turned on sequentially with a delay by a delay time d of the delay circuit 104. After all of the transistors $PSW_{1-i}$ of the first transistor unit $PSWA_1$ connected to the first delay circuit unit $104A_1$ are thus turned on, and the allowance time α has further passes, a second control signal is supplied from the control signal supply source 131A to the second control signal input terminal $109_2$ connected to the second delay circuit unit $104A_2$. Thus configured, the transistors $PSW_{1-n}$, though grouped into the first-mth transistor units $PSWA_{1-m}$, are sequentially turned on in increasing order of current capacity.

Figure 2:
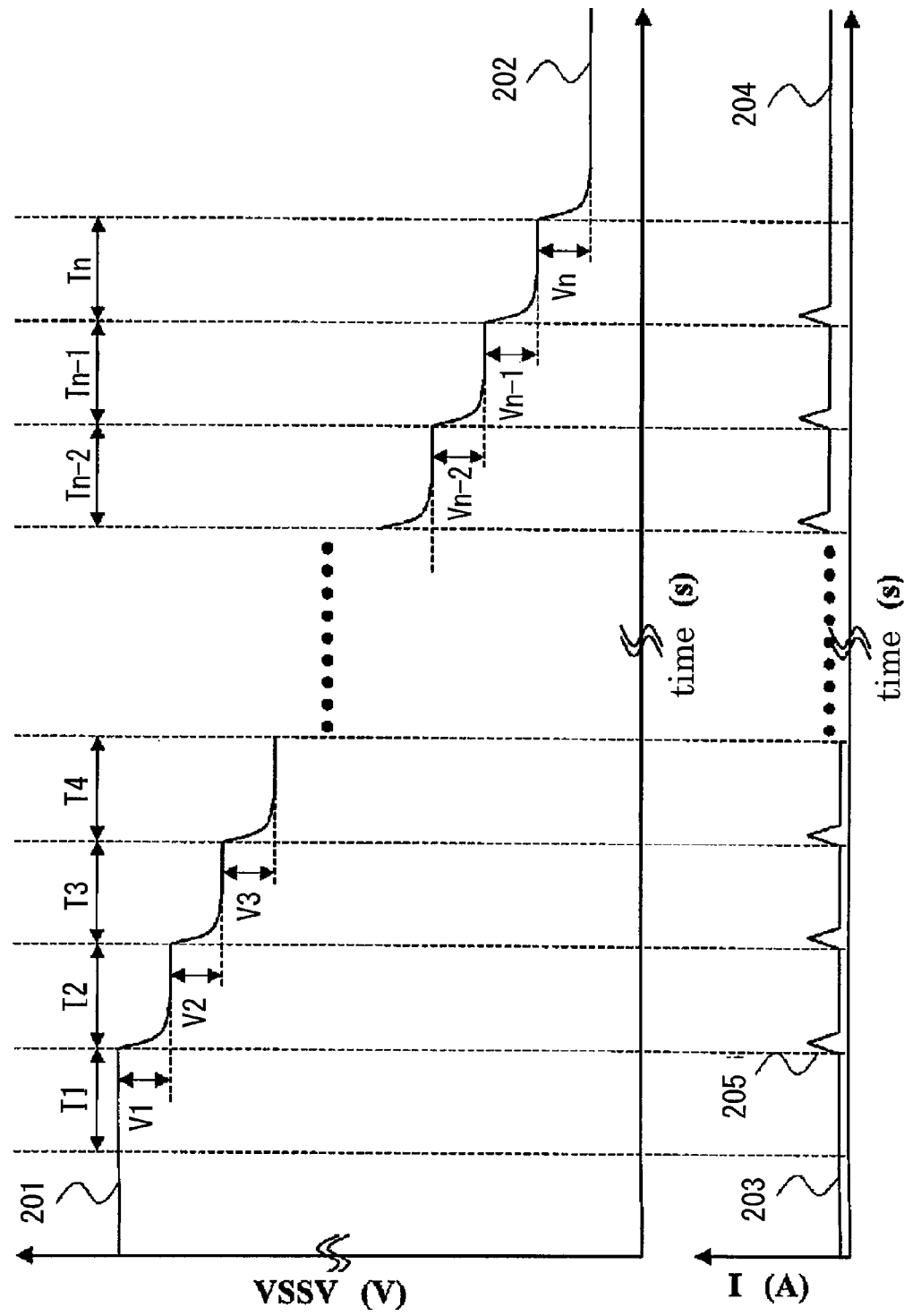
FIG. 2 is a drawing illustrating a pseudo ground potential and a current variation according to the present invention.

FIG. 2 is an illustration of the pseudo ground 108 and characteristics of the current running therethrough at the time of a return to a poser supplied state from a power cutoff state according to the preferred embodiment 1. The transistors $PSW_{1-n}$ are turned on in increasing order of current capability, so that a potential of the pseudo ground 108 continues to drop stepwise from a potential level 201 of the pseudo ground 108 at a power cutoff time to a potential level 202 of the pseudo ground 108 at a power supplied time. T1-Tn illustrated in FIG. 2 denote the delay times created by the delay circuits $104_{1-n}$, which basically represent the same value. V1-Vn denote a potential difference generated when the transistors $PSW_{1-n}$ are turned on. It is desirable that the potential differences V1-Vn be basically equal to one another. To decide the size of the transistors $PSW_{1-n}$, variations deriving from processing steps, applied voltages, and generated temperatures in the controlled circuit 101 and the switch circuit 102 (transistor $PSW_{1-n}$) must be taken into consideration.

When the transistors $PSW_{1-n}$ are thus turned on step by step and in increasing order of current capability, charges accumulated in the controlled circuit 101 can be gradually drawn out. Therefore, an instantaneous carrying current 205 can be reduced to such a low level that is unlikely to cause any problems. A leak current 203 at a power cutoff time runs before the flow of the instantaneous carrying current 205, while a leak current 204 at power supplied time runs after the flow of the instantaneous carrying current 205. At that time, the leak current 203 is smaller than the leak current 204.

The delay times T1-Tn can be arbitrarily decided by the delay circuits $104_{1-n}$. The reduction of the instantaneous carrying current can be more effectively achieved as an overall tilt of the potential variation is more moderate. The potential differences V1-Vn can be decided by adjusting the current capabilities of the transistors $PSW_{1-n}$. The current capabilities of the transistors $PSW_{1-n}$, can be arbitrarily set by adjusting, for example, channel lengths and channel widths of the transistors. The instantaneous carrying current can be more effectively reduced as the values of the potential differences V1-Vn are smaller.

The number of the delay circuits $104_{1-n}$ to be provided is basically equal to the number of the transistors $PSW_{1-n}$. As far as the transistors PSW$_{1-n}$ can be turned on at certain time intervals, the delay circuit 104B$_1$ positioned first in the direction of the circuit connection may be omitted in the delay circuit groups 104A$_{1-m}$.

The values of the delay times T1-Tn and the potential differences V1-Vn basically have the same values. However, these values may be intentionally changed in order to efficiently reduce the instantaneous carrying current and shorten the transition time to such a level that causes no problems.

Preferred Embodiment 2

Figure 3:
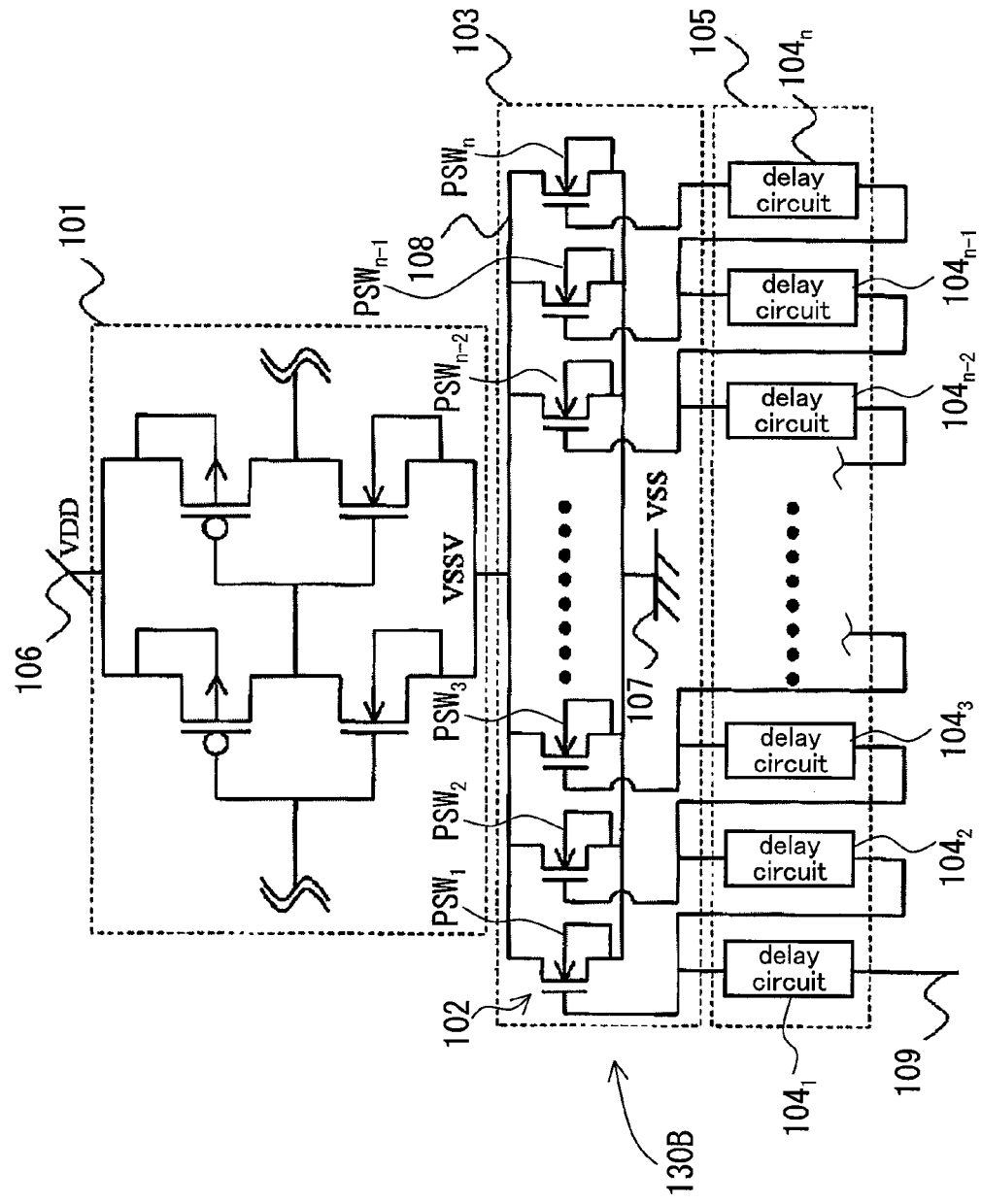
FIG. 3 is a circuit diagram illustrating a preferred embodiment 2 of the present invention.

FIG. 3 is an illustration of a preferred embodiment 2 of the present invention. The preferred embodiment 2 provides a basic structure similar to that of the preferred embodiment 1 except that a controller 130B according to the present preferred embodiment comprises only one control signal input terminal 109, and the control signal supply source 131A is not provided. In the controller 130B, a single control signal produced based on a reference clock of LSI is supplied thereto. Moreover, the delay circuits 140$_{1-n}$ are not divided into different groups, and are connected in series to one another. The control signal is supplied to the delay circuit 104$_1$ positioned first.

Time intervals at which the transistors PSW$_{1-n}$ constituting the switch circuit 102 are sequentially turned on in increasing order of current capability based on the single control signal are set by adjusting the delay times in the delay circuits 104$_{1-n}$. The controller 130B according to the present preferred embodiment is provided with the single control signal input terminal 109, which makes it unnecessary to divide the delay circuits 104$_{1-n}$ and the transistors$_{1-n}$, into groups The present preferred embodiment accomplishes the same effect of reducing the instantaneous carrying current as in the preferred embodiment 1. Another advantage of the present preferred embodiment is that because only a single control signal is used, the layouts of control mechanism (control signal supply source) and signal wires on the side of the semiconductor integrated circuit become easy.

Preferred Embodiment 3

Figure 4:
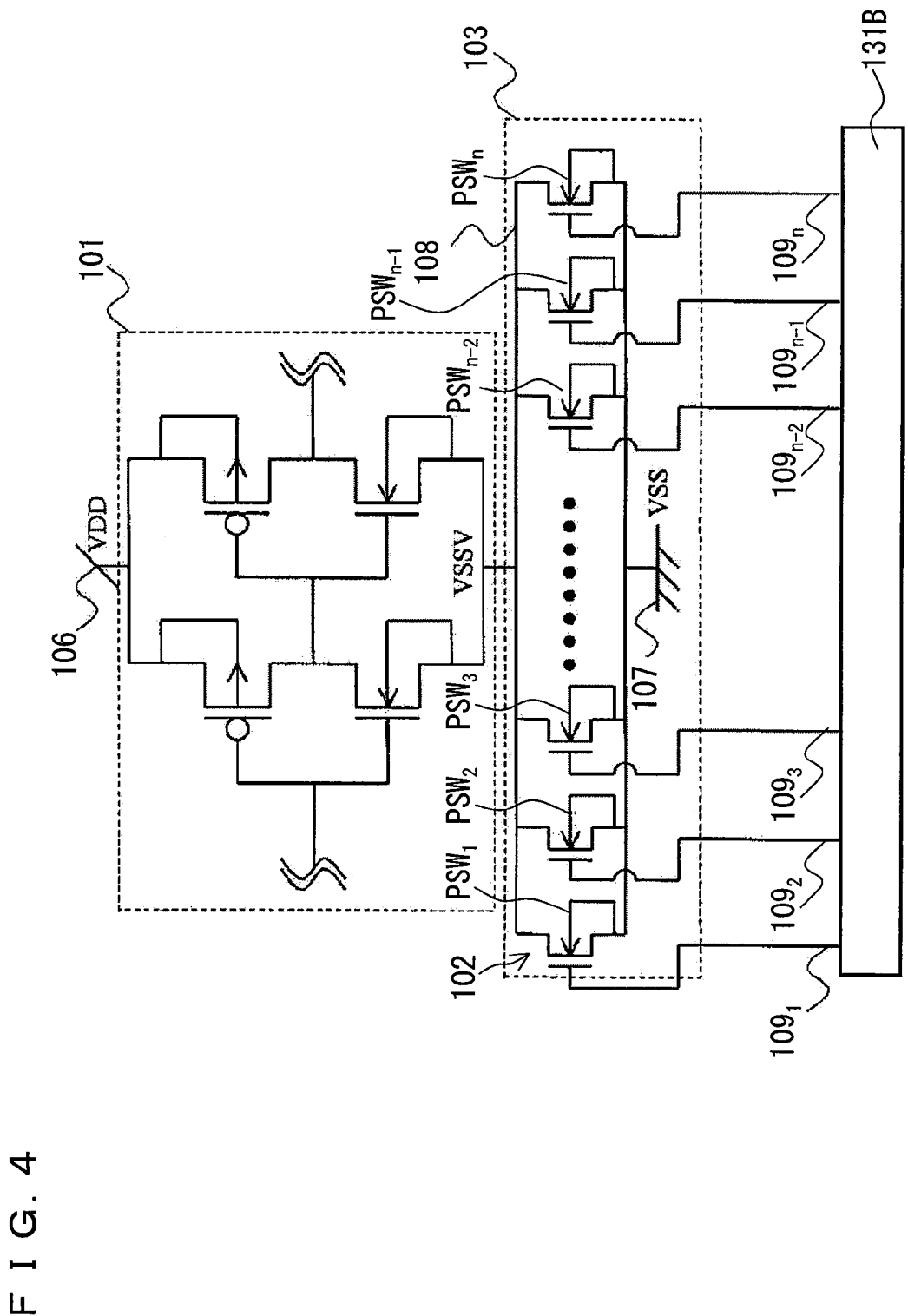
FIG. 4 is a circuit diagram illustrating a preferred embodiment 3 of the present invention.
Figure 5:
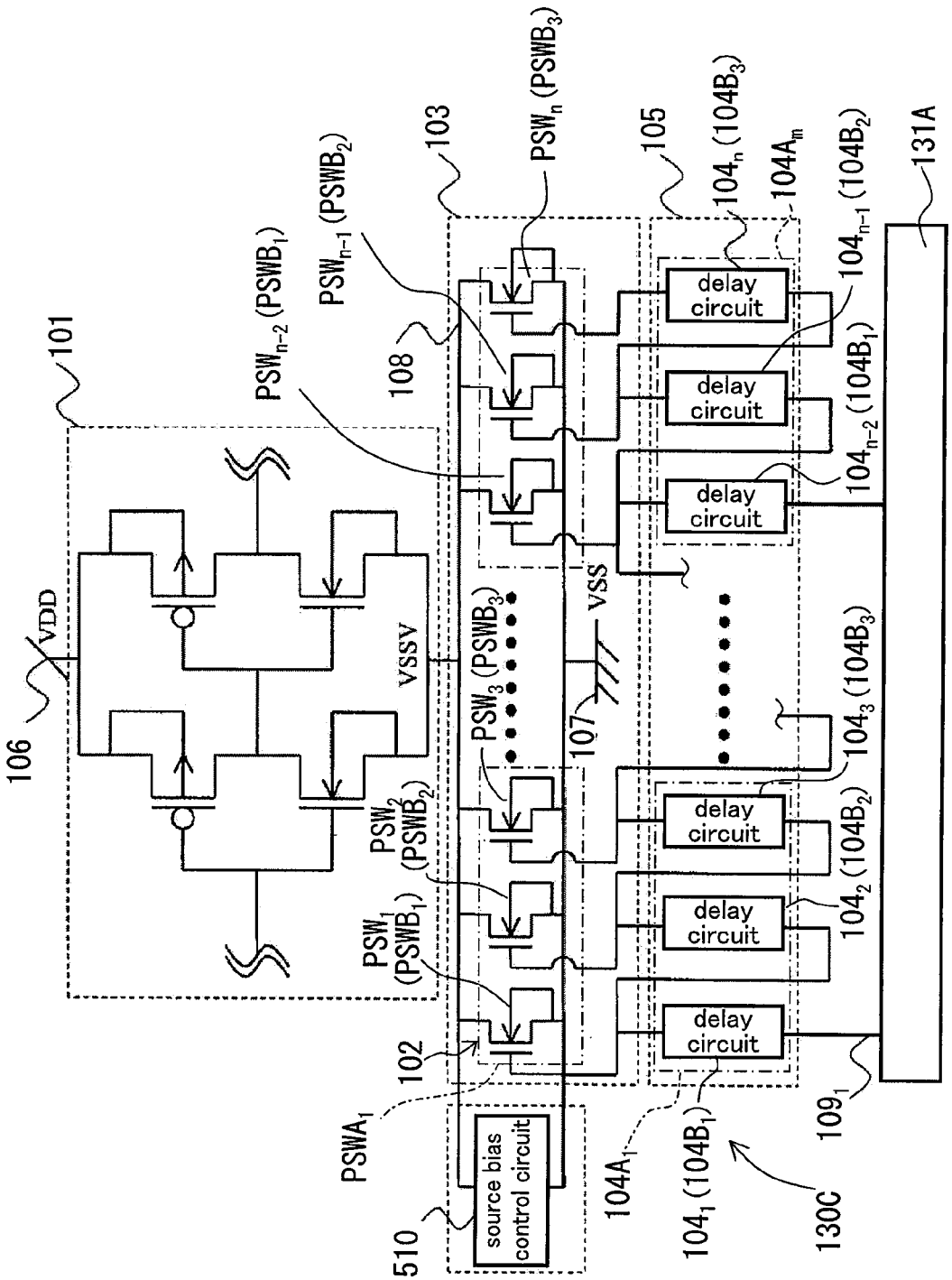
FIG. 5 is a circuit diagram illustrating a preferred embodiment 4 of the present invention.

FIG. 4 is an illustration of a preferred embodiment 3 of the present invention. The preferred embodiment 3 provides a basic structure similar to that of the preferred embodiment 1 except that a controller 130C according to the present preferred embodiment is provided with a control signal supply source 131B in place of the delay circuits 104$_{1-n}$. Furthermore, as many control signal input terminals 107$_{1-n}$ as the transistors PSW$_{1-n}$ are provided and these control signal input terminals are each connected to the gates of the transistors$_{1-n}$. The control signal supply source 131B produces first-nth control signals whose outputs are converted at certain time intervals in correspondence with the transistors PSW$_{1-n}$, based on a reference clock of LSI. The control signal supply source 131B then supplies the produced first-nth control signals to the control signal input terminals 107$_{1-n}$. The control signal input terminals 107$_{1-n}$ supply the first-nth control signals thus received to the corresponding transistors PSW$_{1-n}$.

The ON-control of the transistors PSW$_{1-n}$ is implemented as follows: The transistors PSW$_{1-n}$ are sequentially turned on in increasing order of current capability based on the first-nth control signals supplied to the control signal input terminals 107$_{1-n}$. The present preferred embodiment accomplishes the same effect of reducing the instantaneous carrying current as in the present preferred embodiment. Another advantage of the present preferred embodiment is area reduction with no use of delay circuits.

Preferred Embodiment 3

FIG. 4 is an illustration of a preferred embodiment 3 of the present invention. The preferred embodiment 3 provides a basic structure similar to that of the preferred embodiment 1 except that a controller 130D according to the present preferred embodiment comprises a source bias control circuit 510 in addition to the configuration according to the preferred embodiment 1 (controller 130A). The source bias control circuit 510 comprises a current source and resister elements, and is provided between the ground 107 and the pseudo ground 108. The source bias control circuit 510 secures the pseudo ground 108 at such a voltage that a current running through the source bias control circuit 510 and the leak current running through the controlled circuit 101 come into balance with each other even if the switch circuit 102 falls into a power cutoff state. To provide the source bias circuit 510 is technically advantageous because the same effect as the power source control can be obtained, and units of the circuit blocks to be controlled can be more finely set.

This technology may, however, destroy data retained in the controlled circuit 101 if the potential of the pseudo ground 108 shows a sharp up-and-down variation. In order to deal with the risk, the potential variation of the pseudo ground 108 is adjusted in the same manner as in the preferred embodiment 1, so that the source bias control circuit 510 can be prevented from malfunctioning.

So far were described the preferred embodiments of the present invention. The application of the present invention is not necessarily limited to the power control and source bias for controlling the ground side. The present invention can employ a similar configuration to be used to control the power source side, thereby exerting a similar effect.

The switch circuit location area 105, in which the switch circuit 102 according to the present invention is provided, may be divided and then disposed.

The present invention is not only applicable in the transition from a power cutoff state to a power supplied state but also is applicable in the transition from a power supplied state to a power cutoff state. The present invention can be easily implemented in the latter case by sequentially turning off the switch circuit 102 in decreasing order of current capability at certain time intervals.

Below are described devices in which the semiconductor integrated circuit device according to the present invention is provided. FIG. 6 is a schematic illustration of a mobile telephone 601 which is an example of a communication device comprising the semiconductor integrated circuit device according to the present invention. The mobile telephone 601 comprises a base band LSI 602 and an application LSI 603. The base band LSI 602 and the application LSI 603 are semiconductor integrated circuits each comprising the semiconductor integrated circuit device according to the present invention. The semiconductor integrated circuit device according to the present invention is operable with less power consumption than usual. Therefore, the operations of the base band LSI 602 and the application LSI 603 and the mobile telephone 601 comprising these LSIs can also achieve low power consumption. Moreover, when the semiconductor integrated circuit device according to the present invention is used as a logic circuit in any semiconductor integrated circuit provided in the mobile telephone 601 other than the base band LSI 602 and the application LSI 603, the same effect as described earlier can be obtained.

Figure 7:
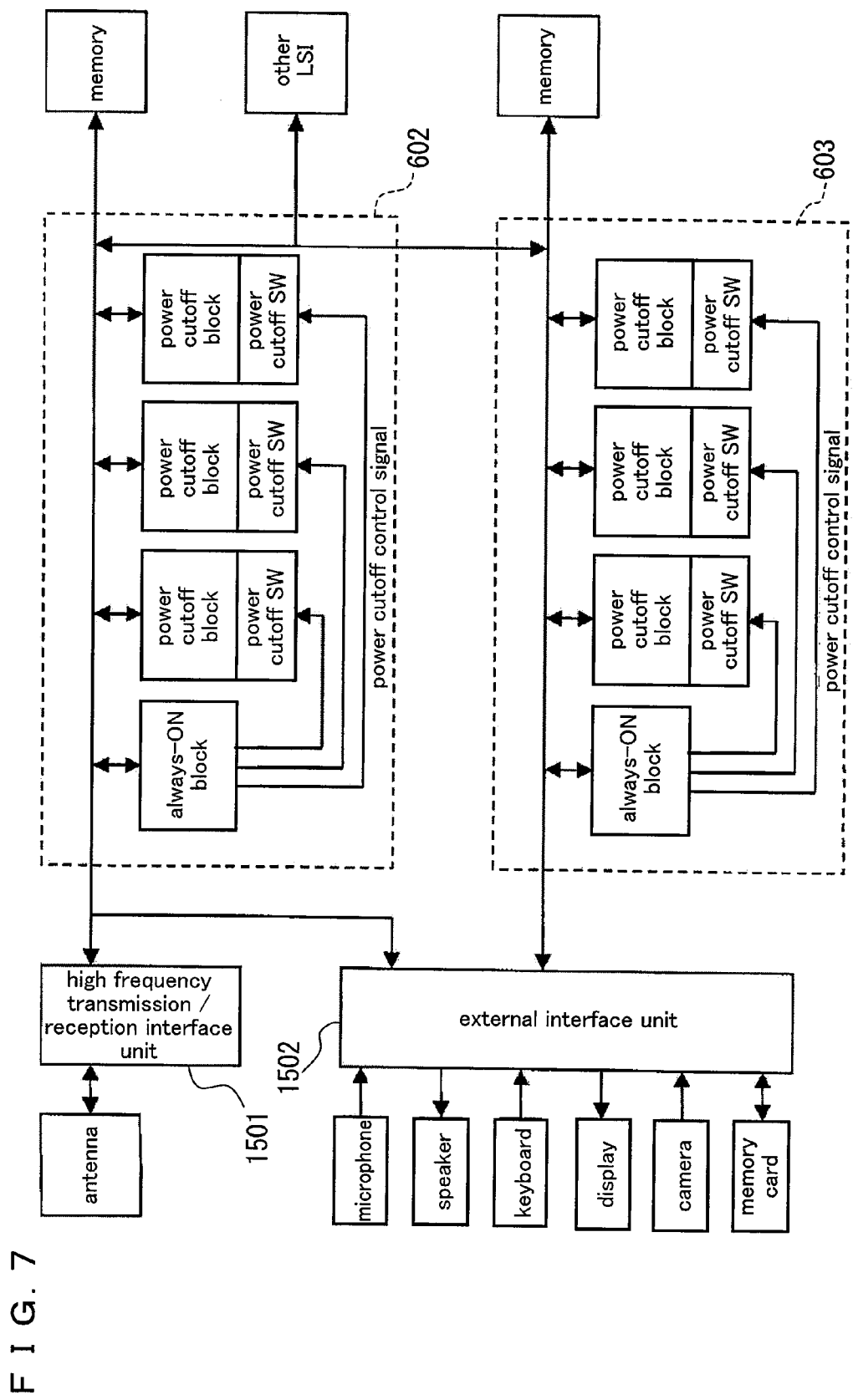
FIG. 7 is a block diagram illustrating a relationship between the present invention and the communication device.

FIG. 7 is a block diagram illustrating a relationship between the present invention and the communication device. The operation according to the present invention in the base band LSI 602 is carried out by:

transmitting an electrical signal to the base band LSI 602 by way of a high-frequency transmission/reception interface unit 1501 or an external input interface unit 1502 at regular intervals based on a recognition result of a timer in the base band LSI 602;

transmitting an electrical signal to the base band LSI 602 by way of the high-frequency transmission/reception interface unit 1501 based on a high frequency signal received by an antenna of the mobile telephone 601; and transmitting an electrical signal to the base band LSI 602 by way of the external input interface unit 1502 based on an input to a keyboard of the mobile telephone 601.

The operation according to the present invention in the application LSI 603 carried out by, transmitting an electrical signal to the application LSI 603 by way of the external input interface unit 1502 based on an input to a keyboard of the mobile telephone 601.

FIG. 7 shows an example of the relationship between the present invention and a communication device, and the functions of the mobile telephone 601 are not limited to those given in this description. The mobile telephone 601 may further comprise other functions and be differently configured as far as it does not cause any troubles in its system, and the functions included in each LSI can be modified as far as they can be integrated.

A communication device comprising the semiconductor integrated circuit device according to the present invention is not necessarily limited to a mobile telephone, and may include other devices such as a transmitter or a receiver in a communication system, and a modem device for data transmission. According to the present invention, power consumption can be effectively reduced in all kinds of communication devices irrespective of whether they are cabled/wireless, optical communication/electrical communication, or digital/analog devices.

FIG. 8 is a schematic illustration of an optical disc device 801 which is an example of an information reproducing device comprising the semiconductor integrated circuit device according to the present invention. The optical disc device 801 comprises a media signal processing LSI 802 for processing a signal read from an optical disc, and an error correction/servo processing LSI 803 for correcting an error of the signal and servo-controlling an optical pickup. The media signal processing LSI 802 and the error correction/servo processing LSI 803 are semiconductor integrated circuits each comprising the semiconductor integrated circuit device according to the present invention.

The semiconductor integrated circuit device according to the present invention can be operated with less power consumption than usual. Therefore, the media signal processing LSI 802 and the error correction/servo processing LSI 803 also require less power for their operations. Moreover, the optical disc device 801 comprising these LSIs 802 and 803 can achieve a low power operation.

When the semiconductor integrated circuit device according to the present invention is used as a logic circuit of any semiconductor integrated circuit provided in the optical disc device 801 other than the media signal processing LSI 802 and the error correction/servo processing LSI 803, the same effect as described earlier can be obtained.

Figure 9:
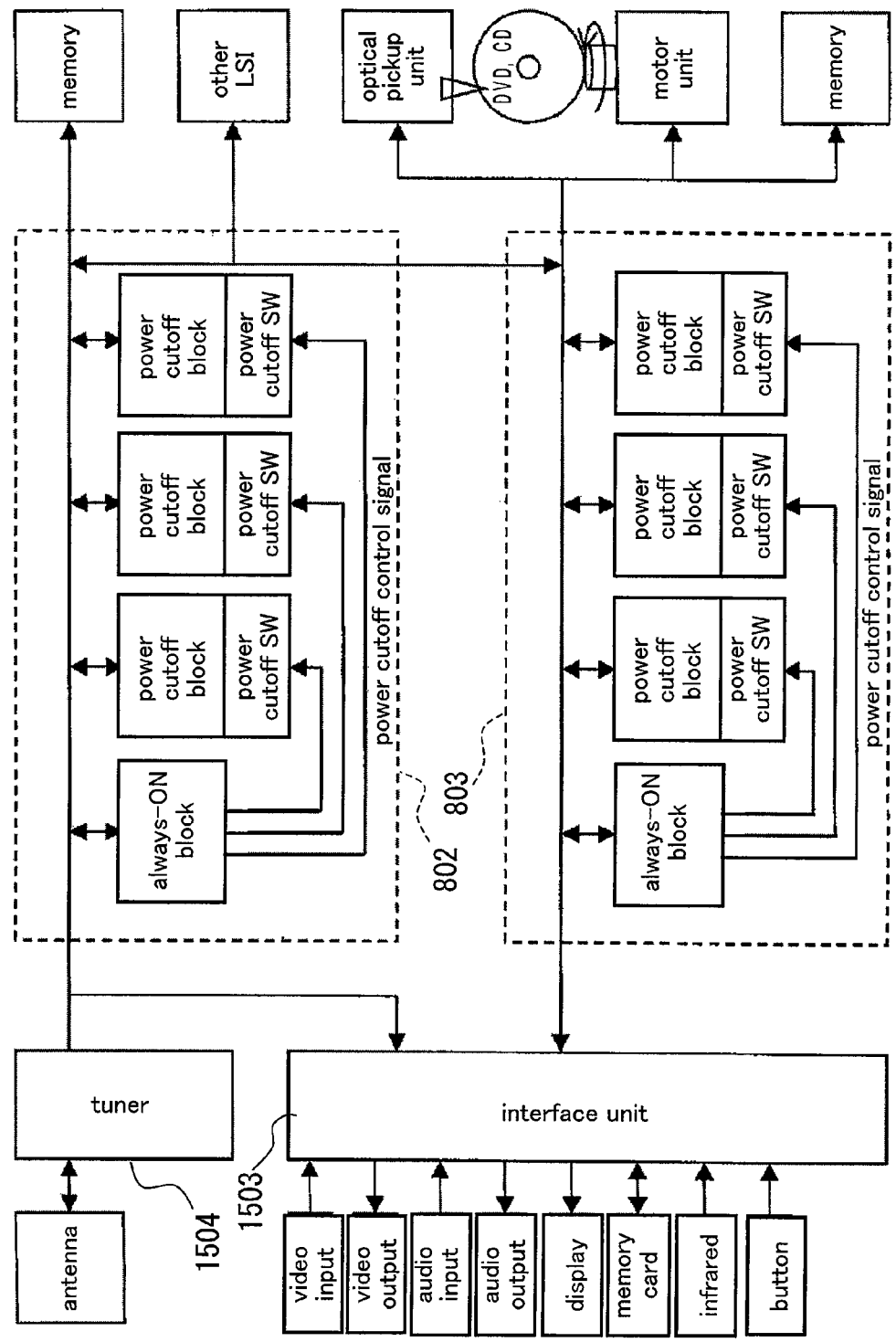
FIG. 9 is a block diagram illustrating a relationship between the present invention and the information reproducing device.

FIG. 9 is a block diagram illustrating a relationship between the present invention and the information reproducing device. The operation according to the present invention in the media signal processing LSI 802 is carried out when an electrical signal is transmitted to the media signal processing LSI 802 by way of an interface unit 1503 or a tuner 1504 based on:

input by means of infrared or pressing buttons to the optical disc device 801;

input of radio wave (high frequency) to an antenna provided in the optical disc device 801; and output of a DVD signal.

The operation according to the present invention in the error correction/servo processing LSI 803 is carried out when an electrical signal is transmitted to the error correction/servo processing LSI 803 by way of the interface unit 1503 based on:

input by means of infrared or pressing buttons to the optical disc device 801; and output of a DVD signal.

FIG. 9 shows an example of the relationship between the present invention and an information reproducing device, and the functions of the optical disc device 801 are not limited to those given in this description. The optical disc device 801 may further comprise other functions and be differently configured as far as it does not cause any troubles in its system. The functions included in each LSI can be modified as far as they can be integrated.

The information reproducing device comprising the semiconductor integrated circuit device according to the present invention is not necessarily limited to an optical disc device, and may include other devices such as an image recording/reproducing device in which a magnetic disc is incorporated and an information recording/reproducing device in which a semiconductor memory is used as a medium. According to the present invention, power consumption can be effectively reduced in all kinds of information reproducing devices irrespective of media in which information is recorded (an information recording function may be included therein).

FIG. 10 is a schematic illustration of an image display device comprising the semiconductor integrated circuit device according to the present invention. A television receiver 1001 comprises an image/audio processing LSI 1002 for processing image and audio signals, and a display/sound source control LSI 1003 for controlling such devices as a display screen and a speaker. The image/audio processing LSI 1002 and the display/sound source control LSI 1003 are semiconductor integrated circuits each comprising the semiconductor integrated circuit device according to the present invention. The operation of the semiconductor integrated circuit device according to the present invention requires less power consumption than usual. Therefore, the image/audio processing LSI 1002 and the display/sound source control LSI 1003 are also operable with less power consumption. Moreover, the television receiver 1001 comprising these LSIs 1002 and 1003 can also achieve a low power operation.

When the semiconductor integrated circuit device according to the present invention is used as a logic circuit of any semiconductor integrated circuit provided in the television receiver 1001 other than the image/audio processing LSI 1002 and the display/sound source control LSI 1003, the same effect as described earlier can be obtained.

Figure 11:
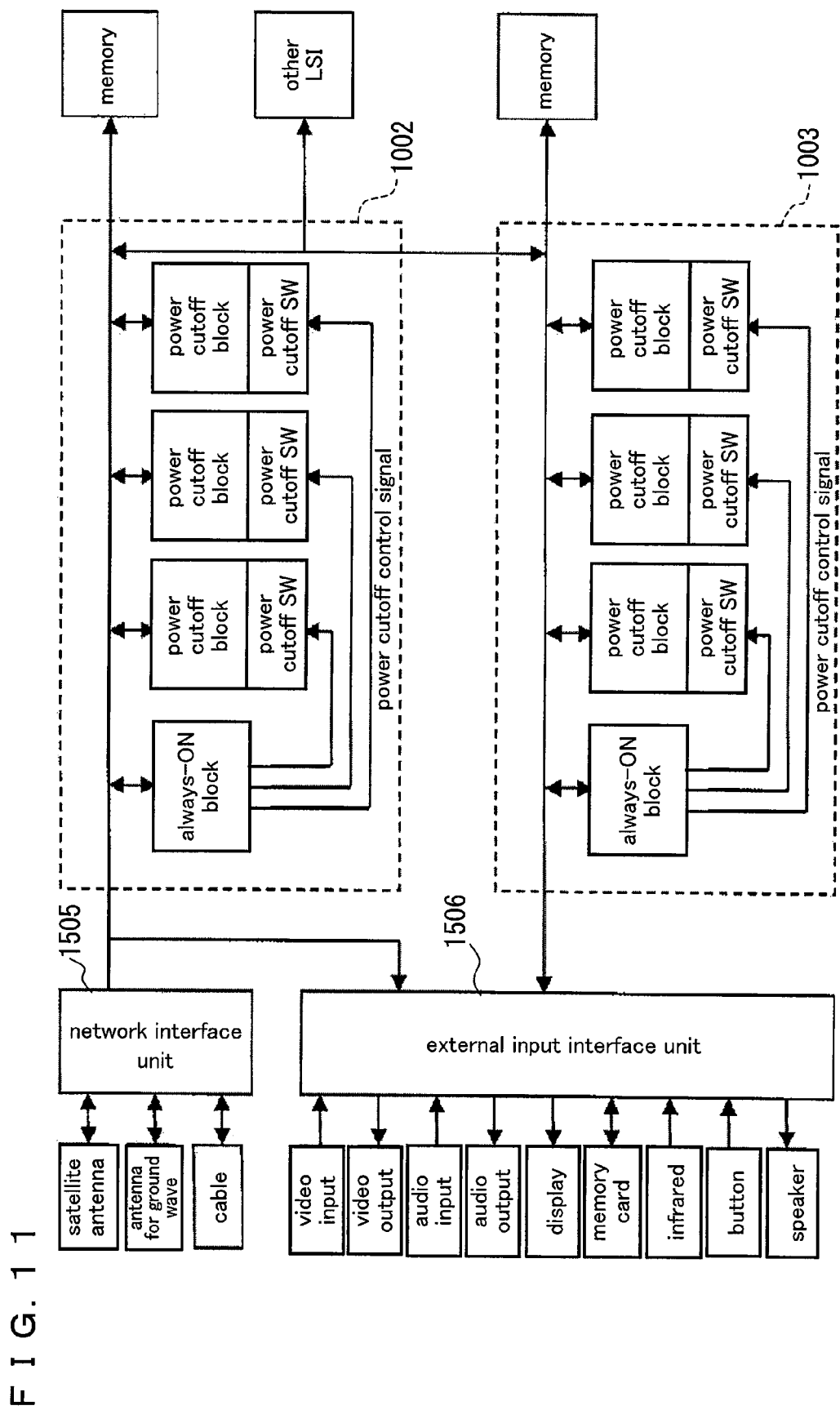
FIG. 11 is a block diagram illustrating a relationship between the present invention and the image display device.

FIG. 11 is a block diagram illustrating a relationship between the present invention and the image display device. The operation according to the present invention in the image/audio processing LSI 1002 is carried out when an electrical signal is transmitted to the image/audio processing LSI 1002 by way of a network interface unit 1505 or an external input interface unit 1506 based on:

input by means of infrared or pressing buttons to the television receiver 1001;

input of radio wave (high frequency) to an antenna provided in the television receiver 1001; and input of a video signal to the television receiver 1001.

The operation according to the present invention in the display/sound source control LSI 1003 is carried out when an electrical signal is transmitted to the display/sound source control LSI 1003 by way of the network interface unit 1505 or the external input interface unit 1506 based on:

input by means of infrared or pressing buttons to the television receiver 1001;

input of radio wave (high frequency) to an antenna provided in the television receiver 1001; and input of a video signal to the television receiver 1001.

FIG. 11 shows an example of the relationship between the present invention and an information reproducing device, and the functions of the television receiver are not limited to those given in this description. The television receiver 1001 may further comprise other functions and be differently configured as far as it does not cause any troubles in its system. The functions included in each LSI can be modified as far as they can be integrated.

An image display device comprising the semiconductor integrated circuit device according to the present invention is not necessarily limited to a television receiver, and may include, for example, a device for displaying streaming data distributed through an electrical communication line. According to the present invention, power consumption can be effectively reduced in all kinds of image display devices regardless of an information transmission method adopted therein.

FIG. 12 is a schematic illustration of a digital camera 1201 which is an example of an electronic device comprising the semiconductor integrated circuit device according to the present invention. The digital camera 1201 comprises a signal processing LSI 1202 which is a semiconductor integrated circuit comprising the semiconductor integrated circuit device according to the present invention. The semiconductor integrated circuit device according to the present invention is operable with less power consumption than usual. Therefore, the signal processing LSI 1202 is also operable with less power consumption. Moreover, the digital camera 1201 comprising the signal processing LSI 1202 can also achieve a low power operation.

When the semiconductor integrated circuit device according to the present invention is used as a logic circuit of any semiconductor integrated circuit provided in the digital camera 1201 other than the signal processing LSI 1202, the same effect as described earlier can be obtained.

Figure 13:
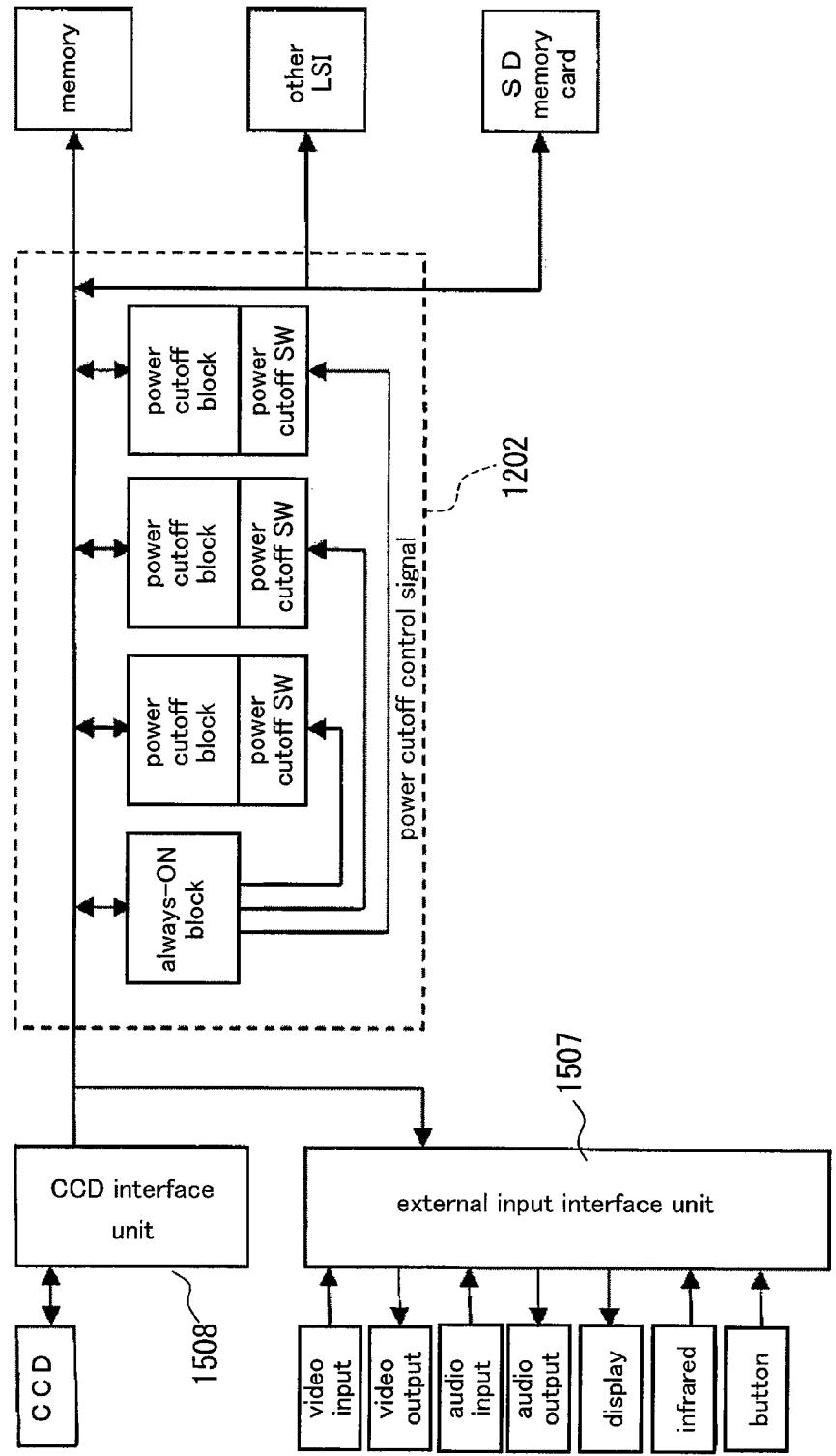
FIG. 13 is a block diagram illustrating a relationship between the present invention and the electronic device.

FIG. 13 is a block diagram illustrating a relationship between the present invention and the electronic device. The operation according to the present invention in the signal processing LSI 1202 is carried out when an electrical signal is transmitted to the signal processing LSI 1202 by way of an external input interface unit 15077 or a CCD interface unit 1508 based on:

input by means of infrared or pressing buttons to the digital camera 1201; and output from CCD provided in the digital camera 1201.

FIG. 13 shows an example of the relationship between the present invention and an electronic device, and the functions of the digital camera 1201 are not limited to those given in this description. The digital camera 1201 may further comprise other functions and be differently configured as far as it does not cause any troubles in its system. The functions included in each LSI can be modified as far as they can be integrated.

The electronic device comprising the semiconductor integrated circuit device according to the present invention is not necessarily limited to a digital camera. Examples of electronic devices may include all kinds of devices comprising a semiconductor integrated circuit such as various sensor devices and electronic calculators. The power reduction can be effectively accomplished in all kinds of electronic devices according to the present invention.

Figure 14:
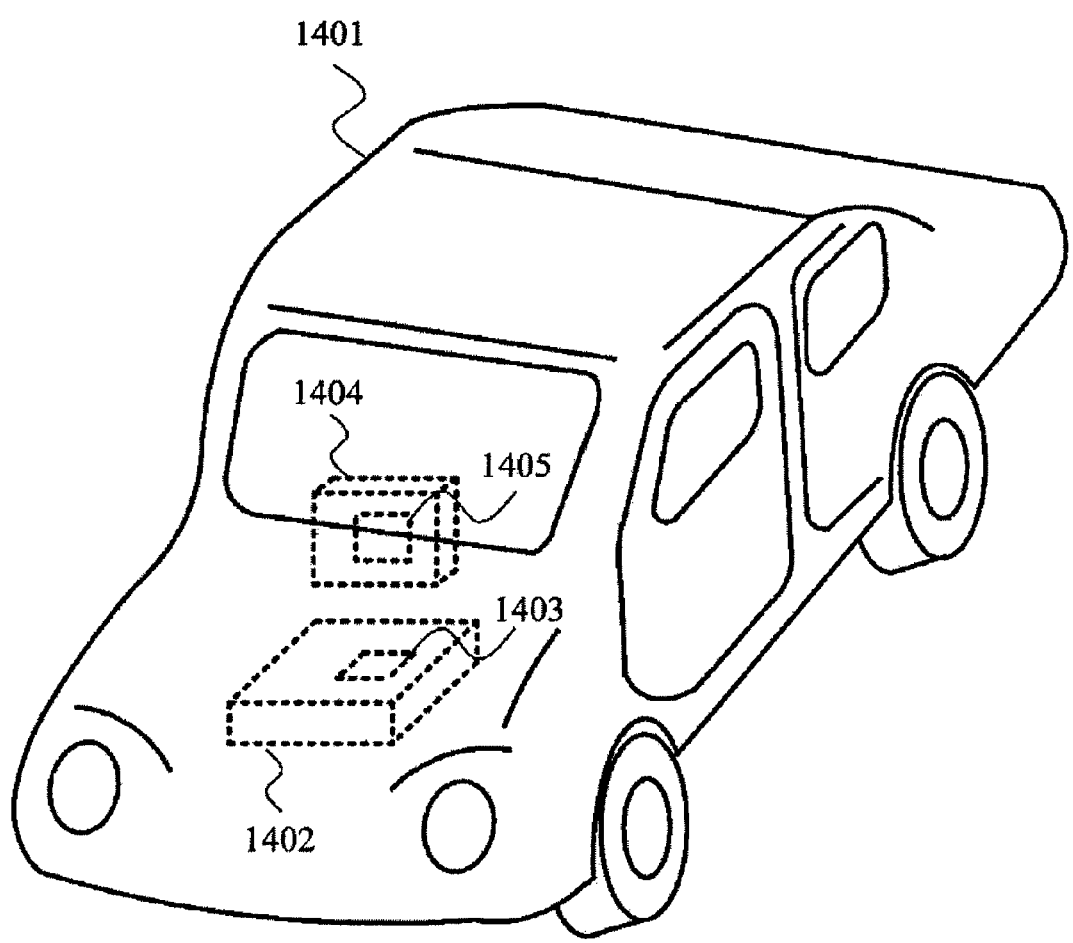
FIG. 14 is a schematic illustration of an electronic control device comprising the semiconductor integrated circuit device according to the present invention and a mobile body comprising the electronic control device.

FIG. 14 is a schematic illustration of an automobile 1401 which is an example of a mobile body comprising an electronic control device in which the semiconductor integrated circuit device according to the present invention is incorporated. The automobile 1401 comprises an electronic control device 1402. The electronic control device 1402 is a semiconductor integrated circuit comprising the semiconductor integrated circuit device according to the present invention, comprising an engine/transmission control LSI 1403 for controlling an engine and a transmission of the automobile 1401. The automobile 1401 further comprises a navigation device 1404. The navigation device 1404 also comprises an LSI 1405 for navigation which is a semiconductor integrated circuit comprising the semiconductor integrated circuit device according to the present invention in the same manner as the electronic control device 1402.

The semiconductor integrated circuit device according to the present invention is operable with less power consumption than usual. Therefore, the engine/transmission control LSI 1403 and the electronic control device 1402$y$ comprising the LSI 1403 are also operable with less power consumption. Moreover, the LSI 1405 for navigation and the navigation device 1404 comprising the LSI 1405 can also achieve a low power operation.

When the semiconductor integrated circuit device according to the present invention is used as a logic circuit in any semiconductor integrated circuit provided in the electronic device 1402 other than the engine/transmission LSI 1403, the same effect as described earlier can be obtained. The same is true of the navigation device 1404. The reduction of power consumption in the electronic control device 1402 leads to the reduction of power consumption in the automobile 1401.

Figure 15:
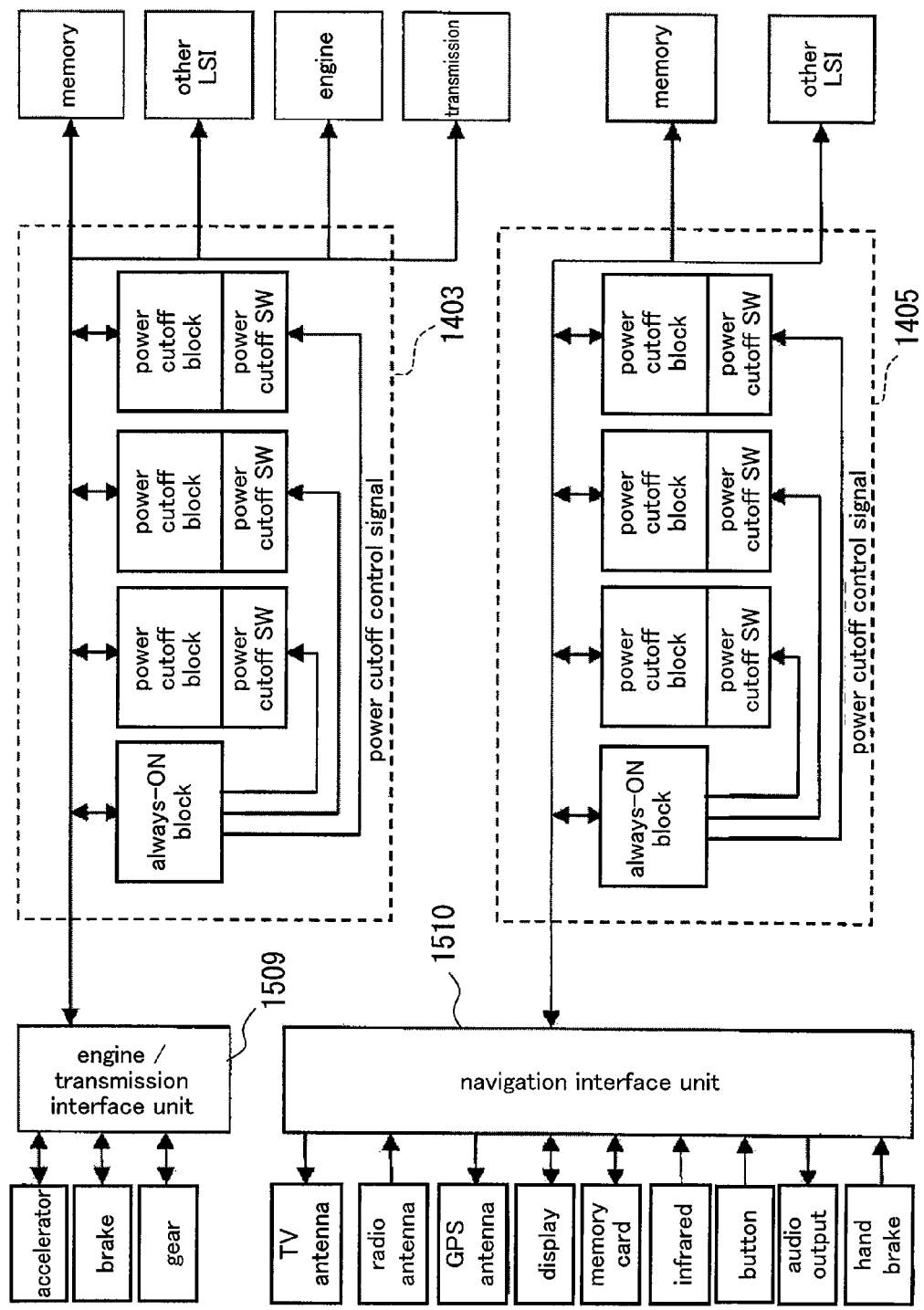
FIG. 15 is a block diagram illustrating a relationship among the present invention, the electronic control device and the mobile body comprising the electronic control device.
Figure 16:
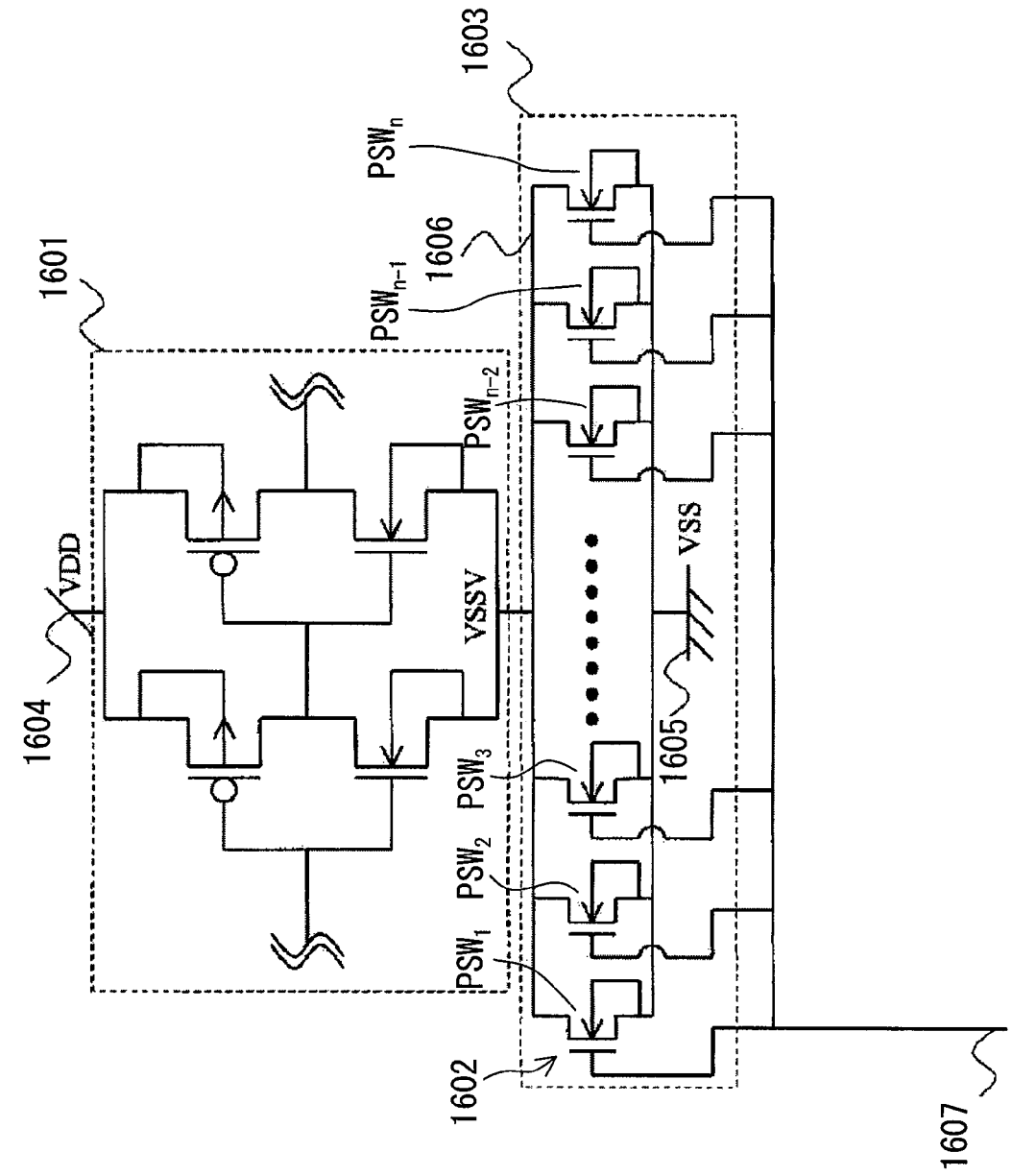
FIG. 16 is a circuit diagram illustrating a power cutoff control according to a conventional technology.
Figure 17:
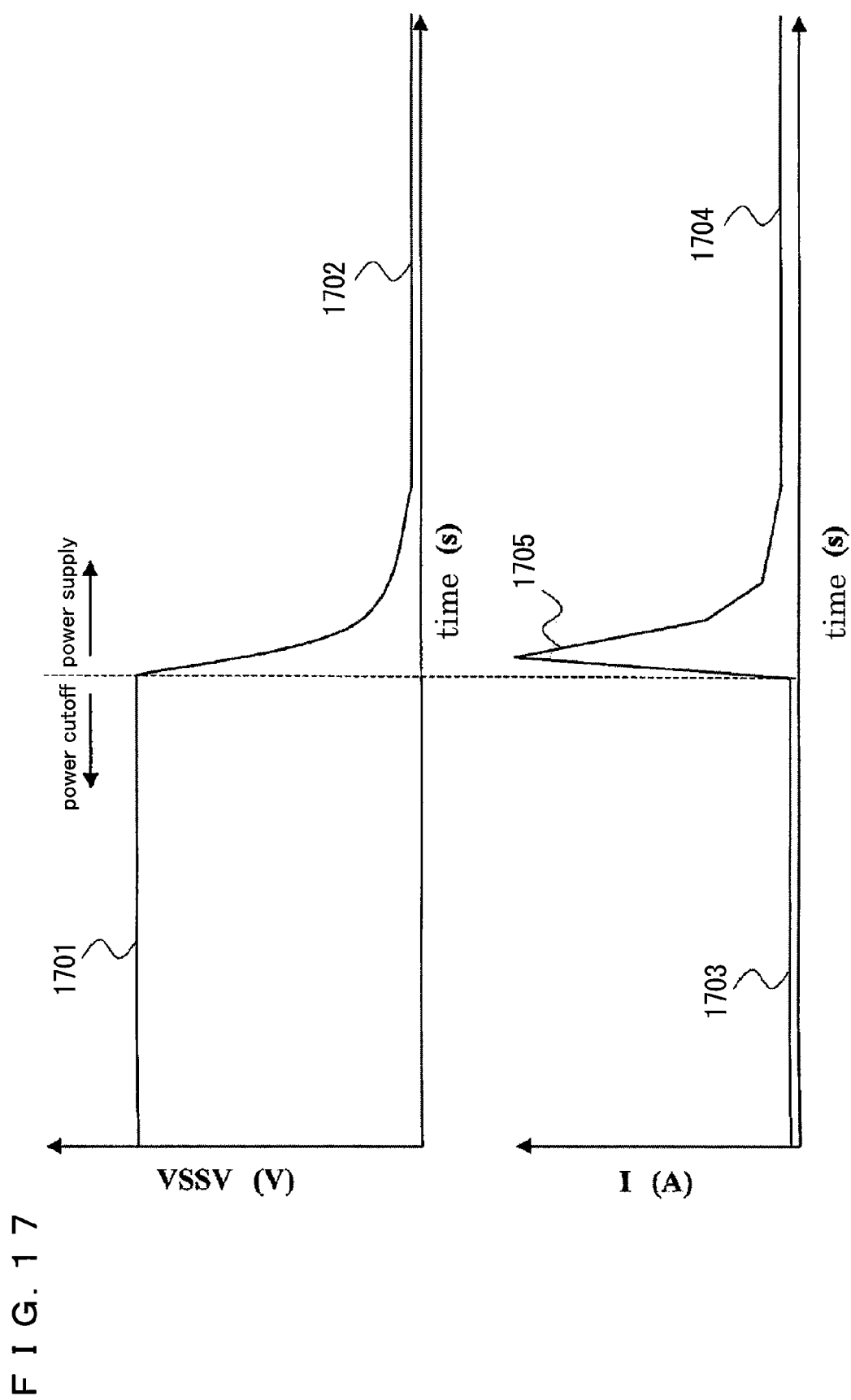
FIG. 17 is a drawing illustrating a pseudo ground potential and a current variation according to the conventional technology.
Figure 18:
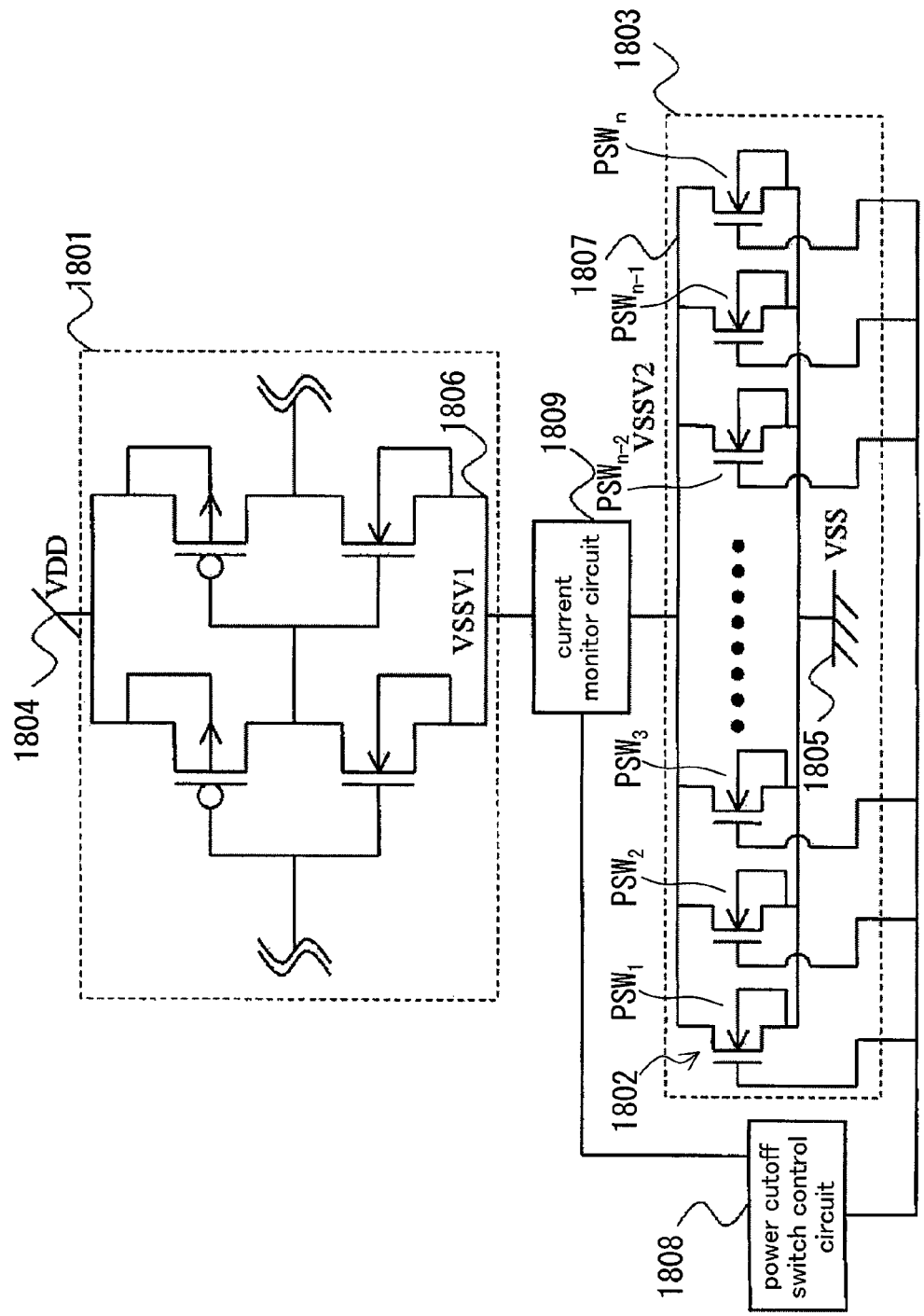
FIG. 18 is a circuit diagram illustrating solution 1 for reducing an instantaneous carrying current according to the conventional technology.
Figure 19:
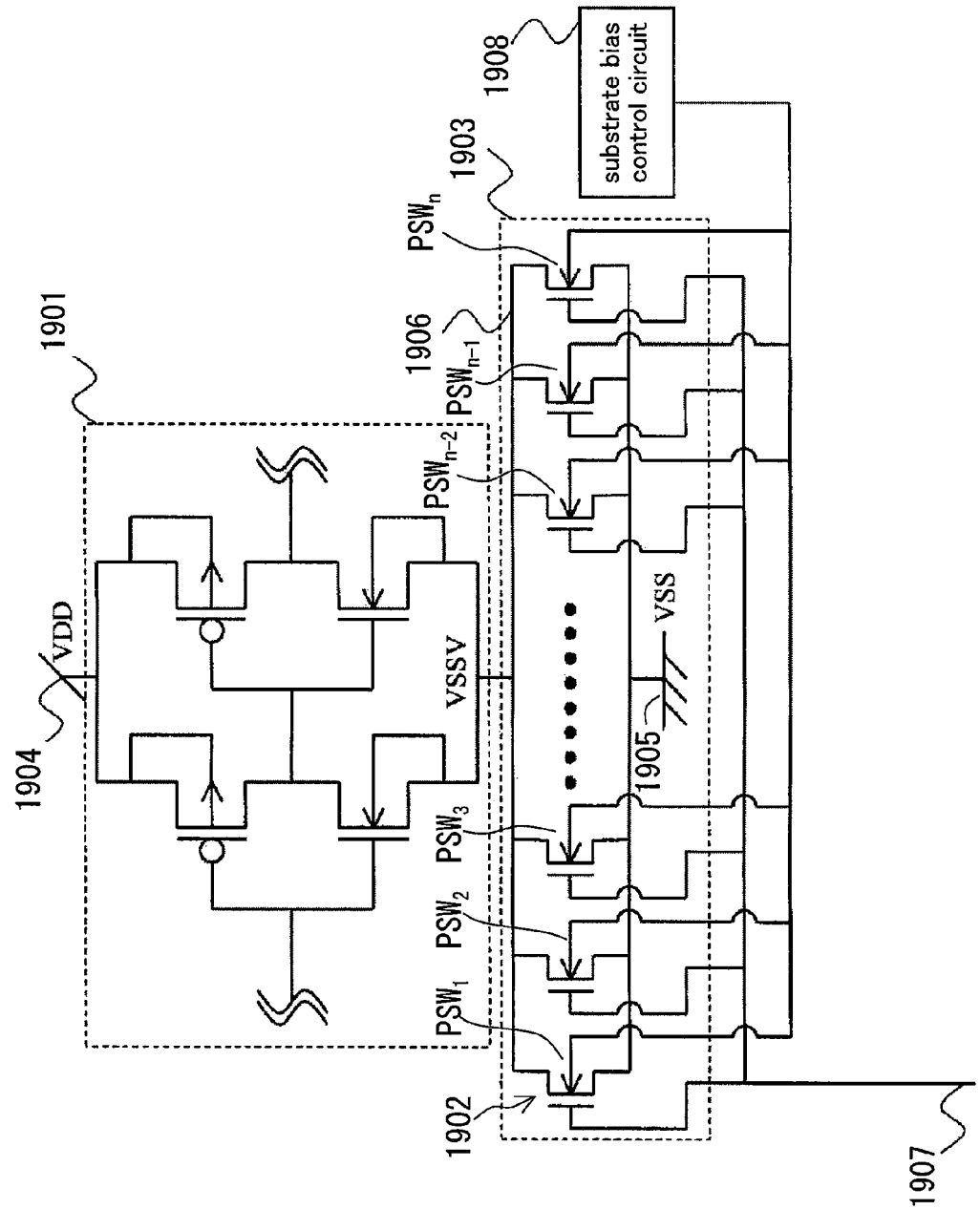
FIG. 19 is a circuit diagram illustrating solution 2 for reducing the instantaneous carrying current according to the conventional technology.

FIG. 15 is a block diagram illustrating a relationship among the present invention, the electronic control device and the mobile body comprising the electronic control device. The operation according to the present invention in the engine/transmission control LSI 1403 is carried out by, transmitting an electrical signal produced when the electronic control device 1402 detects the operations of an accelerator, brake and gear of the automobile 1401 to the engine/transmission control LSI 1403 by way of an engine transmission interface unit 1509.

The operation according to the present invention in the LSI 1405 for navigation is carried out by inputting an electrical signal produced when the navigation device 1404 detects the following to the LSI 1405 for navigation by way of a navigation interface nit 1510:

input of radio wave (high frequency) to a TV antenna provided in the automobile 1401; and input by means of infrared or pressing buttons to the navigation device 1404.

FIG. 15 shows an example of the relationship among the present invention, the electronic control device and the mobile body comprising the electronic control device, and the functions of the automobile 1401, electronic control device 1402 and navigation device 1404 are not limited to those given in this description. These devices may further comprise other functions and be differently configured as far as they do not cause any troubles in their system. The functions included in each LSI can be modified as far as they can be integrated.

The electronic control device comprising the semiconductor integrated circuit device according to the present invention is not necessarily limited to the controller for the engine and the transmission. Examples of the electronic control device includes all kinds of devices comprising a semiconductor integrated circuit and configured to control a power source such as a motor control device. According to the present invention, power consumption can effectively reduced in these electronic control devices.

The mobile body comprising the semiconductor integrated circuit device according to the present invention is not necessary limited to an automobile. Examples of the mobile body include all kinds of moving bodies comprising an electronic control device for controlling an engine and a motor as power sources such as a train and an airplane. According to the present invention, power consumption can effectively reduced in these mobile bodies.

INDUSTRIAL APPLICABILITY

According to the present invention, conventional problems concerning circuit malfunction in the power cutoff technology and source bias control technology can be solved. The method provided by the present invention has a simplified configuration and can be easily carried out, and therefore a wide range of practical applications can be expected. As described so far, the present invention can solve serious problems which occur when the conventional LSI power reduction technology is employed, thereby maximizing the low power consumption effect of LSI.

What is claimed is:

1. A semiconductor integrated circuit comprising:
    a controlled circuit;
    a switch circuit provided with a plurality of transistors connected in parallel, each having different current capabilities, the switch circuit controlling power supply to the controlled circuit; and
    a controller for making the plurality of transistors at a non-conducted state change the non-conducted state to a conducted state at different times, starting with a transistor having a smallest current capability and finishing with a transistor having a largest current capability, wherein:
    each of the plurality of transistors is connected to the controlled circuit,
    the controlled circuit and the switch circuit are disposed in the semiconductor integrated circuit, and
    the plurality of transistors each have the current capabilities in such a way that a variation of a power supply potential generated in the controlled circuit at the time of the transition of the plurality of transistors to the conducted state is made substantively constant.

2. The semiconductor integrated circuit as claimed in claim 1, wherein
    the controller makes the plurality of transistors at the non-conducted state sequentially change from the non-conducted state to the conducted state at certain time intervals, starting with the transistor having the smallest current capability and finishing with the transistor having the largest current capability.

3. The semiconductor integrated circuit device as claimed in claim 1, wherein:
    the controller further comprises a delay circuit for delaying a control signal produced based on a reference clock, and
    the controller sequentially controls conduction of the respective transistors in an order of the current capabilities thereof at certain time intervals determined by combinations of outputs of the delay circuit and the control signal.

4. The semiconductor integrated circuit device as claimed in claim 3, wherein:
    a plurality of the delay circuits are provided so as to correspond to the plurality of transistors, the plurality of delay circuits being connected in series to one another,
    output terminals of the plurality of delay circuits are each connected to bases of the plurality of transistors corresponding thereto, and
    the plurality of delay circuits each delay the control signal inputted to a first delay circuit positioned first in an alignment of the plurality of delay circuits in accordance with a position thereof in the alignment, and supply the delayed control signal to the base of the transistor corresponding thereto.

5. The semiconductor integrated circuit device as claimed in claim 3, wherein
    the controller determines the certain time intervals based on combinations of a single control signal and the plurality of the delay circuits.

6. The semiconductor integrated circuit device as claimed in claim 3, wherein:
    the controller comprises:
        a plurality of delay circuit units; and
        a control signal supply source for producing the control signal specific to each of the delay circuit units and supplying the produced control signals to the delay circuit units,
    the plurality of delay circuit units each comprises a plurality of delay circuits connected in series to one another, and
    the control signal supply source produces the control signals time-shifted relative to each other by a time equivalent to a largest delay time in each of the plurality of delay circuit units, and supplies the produced control signals to the plurality of delay circuits units.

7. The semiconductor integrated circuit device as claimed in claim 3, further comprising a source bias control circuit for controlling a source bias of the controlled circuit, wherein:
    the controller makes the plurality of transistors at the non-conducted state sequentially change from the non-conducted state to the conducted state at certain time intervals, starting with the transistor having the smallest current capability and finishing with the transistor having the largest current capability, when the source bias control circuit shifts from a source bias controlled state to a source bias released state, and
    the controller makes the plurality of transistors at a conducted state sequentially change from the conducted state to a non-conducted state at certain time intervals, starting with the transistor having the largest current capability and finishing with the transistor having the smallest capability when the source bias control circuit shifts from the source bias released state to the source bias controlled state.

8. The semiconductor integrated circuit device as claimed in claim 3, wherein:
the controlled circuit comprises a high voltage side power source and a low voltage side power source, and
the plurality of transistors control the power supply to the controlled circuit by the high voltage side power source.

9. The semiconductor integrated circuit device as claimed in claim 1, wherein the controller sequentially controls conduction of the plurality of transistors in an order of the current capabilities thereof at certain time intervals determined by a control signal produced based on a reference clock.

10. The semiconductor integrated circuit device as claimed in claim 9, wherein:
the controller further comprises a control signal supply source, and
the control signal supply source produces, based on the reference clock, the control signal whose output is converted at the certain time intervals in correspondence with each of the plurality of transistors, and supplies the resulting control signals to bases of the plurality of transistors.

11. A communication device comprising:
a semiconductor integrated circuit comprising:
a controlled circuit;
a switch circuit provided with a plurality of transistors connected in parallel, each having different current capabilities, the switch circuit controlling power supply to the controlled circuit; and
a controller for making the plurality of transistors at a non-conducted state change the a non-conducted state to a conducted state at different times, starting with a transistor having a smallest current capability and finishing with a transistor having a largest current capability;
a high-frequency transmission/reception interface unit connected to the semiconductor integrated circuit device; and
an external input interface unit connected to the semiconductor integrated circuit device, wherein:
each of the plurality of transistors is connected to the controlled circuit,
the controlled circuit and the switch circuit are disposed in the semiconductor integrated circuit,
the plurality of transistors each have the current capabilities in such a way that a variation of a power supply potential generated in the controlled circuit at the time of the transition of the plurality of transistors to the conducted state is made substantively constant, and
the controller controls the switch circuit based on an electrical signal received by the semiconductor integrated circuit device by way of the high-frequency transmission/reception interface unit or the external input interface unit.

12. A semiconductor integrated circuit device comprising:
a controlled circuit;
a switch circuit provided with a plurality of transistors connected in parallel, each having different current capabilities, the switch circuit controlling power supply to the controlled circuit; and
a controller for making the plurality of transistors at a conducted state at different times change from the conducted state to a non-conducted state, starting with a transistor having a largest current capability and finishing with a transistor having a smallest current capability, wherein:
each the plurality of transistors is connected to the controlled circuit,
the controlled circuit and the switch circuit are disposed in the semiconductor integrated circuit, and
the plurality of transistors respectively have the current capabilities in such a way that a variation of a power supply potential generated in the controlled circuit at the time of the transition of the plurality of transistors to the non-conducted state is made substantially constant.

13. The semiconductor integrated circuit device as claimed in claim 12, wherein the controller makes the plurality of transistors at the conducted state sequentially change form the conducted state to the non-conducted state at certain time intervals, starting with the transistor having the largest current capability and finishing with the transistor having the smallest current capability.

14. The semiconductor integrated circuit device as claimed in claim 12, wherein:
the controller further comprises a delay circuit for delaying a control signal produced based on a reference clock, and
the controller sequentially controls conduction of the respective transistors in an order of the current capabilities thereof at certain time intervals determined by combinations of outputs of the delay circuit and the control signal.

15. The semiconductor integrated circuit device as claimed in claim 14, wherein:
a plurality of the delay circuits are provided so as to correspond to the plurality of transistors, the plurality of delay circuits being connected in series to one another,
output terminals of the plurality of delay circuits are connected to bases of the plurality of transistors corresponding thereto, and
the plurality of delay circuits each delay the control signal inputted to a first delay circuit positioned first in an alignment of the plurality of delay circuits in accordance with the position thereof in the alignment, and supply the delayed control signal to the base of the plurality of transistor corresponding thereto.

16. The semiconductor integrated circuit device as claimed in claim 14, wherein the controller determines the certain time intervals based on combinations of a single control signal and the plurality of the delay circuits.

17. The semiconductor integrated circuit device as claimed in claim 14, wherein:
the controller comprises:
a plurality of delay circuit units; and
a control signal supply source for producing the control signal specific to each of the plurality of delay circuit units and supplying the produced control signals to the respective delay circuit units,
the plurality of delay circuit units each comprises a plurality of delay circuits connected in series to one another, and
the control signal supply source produces the control signals time-shifted relative to each other by a time equivalent to a largest delay time in each of the plurality of delay circuit units, and supplies the produced control signals to the respective delay circuit units.

18. The semiconductor integrated circuit device as claimed in claim 14, further comprising a source bias control circuit for controlling a source bias of the controlled circuit, wherein:
the controller makes the plurality of transistors at the non-conducted state sequentially change from the non-conducted state to the conducted state at certain time intervals, starting with the transistor having the smallest current capability and finishing with the transistor having the largest current capability when the source bias control circuit shifts from a source bias controlled state to a source bias released state, and the controller makes the plurality of transistors at a conducted state sequentially change from the conducted state to a non-conducted state at certain time intervals, starting with the transistor having the largest current capability and finishing with the transistor having the smallest current capability when the source bias control circuit shifts from a source bias released state to a source bias controlled state.

19. The semiconductor integrated circuit device as claimed in claim 14, wherein:

the controlled circuit comprises a high voltage side power source and a low voltage side power source, and the plurality of transistors control the power supply to the controlled circuit by the high voltage side power source.

20. The semiconductor integrated circuit device as claimed in claim 12, wherein the controller sequentially controls conduction of the plurality of transistors in an order of the current capabilities thereof at certain time intervals determined by a control signal produced based on a reference clock.

21. The semiconductor integrated circuit device as claimed in claim 20, wherein:

the controller further comprises a control signal supply source, and the control signal supply source produces, based on the reference clock, the control signal whose output is converted at the certain time intervals in correspondence with each of the plurality of transistors and supplies the resulting control signals to bases of the plurality of transistors.

22. A communication device comprising:

a semiconductor integrated circuit device comprising:
a controlled circuit,
a switch circuit provided with a plurality of transistors connected in parallel, each having different current capabilities, the switch circuit controlling power supply to the controlled circuit; and
a controller for making the plurality of transistors at a conducted state at different times change from the conducted state to a non-conducted state, starting with the transistor having a largest current capability and finishing with the transistor having a smallest current capability;

a high-frequency transmission/reception interface unit connected to the semiconductor integrated circuit device; and an external input interface unit connected to the semiconductor integrated circuit device, wherein:

each the plurality of transistors is connected to the controlled circuit, the controlled circuit and the switch circuit are disposed in the semiconductor integrated circuit, the plurality of transistors respectively have the current capabilities in such a way that a variation of a power supply potential generated in the controlled circuit at the time of the transition of the plurality of transistors to the non-conducted state is made substantially constant, and the controller controls the switch circuit based on an electrical signal received by the semiconductor integrated circuit device by way of the high-frequency transmission/reception interface unit or the external input interface unit.

23. A semiconductor integrated circuit comprising:

a controlled circuit;

a switch circuit provided with a plurality of transistors connected in parallel, each having different current capabilities, the switch circuit controlling power supply to the controlled circuit; and a controller for making the plurality of transistors at a non-conducted state change the non-conducted state to a conducted state at different times, starting with a transistor having a relatively small current capability and finishing with a transistor having a relatively large current capability, wherein:

each of the plurality of transistors is connected to the controlled circuit, the controlled circuit and the switch circuit are disposed in the semiconductor integrated circuit, and the plurality of transistors each have the current capabilities in such a way that a variation of a power supply potential generated in the controlled circuit at the time of the transition of the plurality of transistors to the conducted state is made substantively constant.

24. A semiconductor integrated circuit device comprising:

a controlled circuit;

a switch circuit provided with a plurality of transistors connected in parallel, each having different current capabilities, the switch circuit controlling power supply to the controlled circuit; and a controller for making the plurality of transistors at a conducted state at different times change from the conducted state to a non-conducted state, starting with a transistor having a relatively large current capability and finishing with a transistor having a relatively small current capability, wherein:

each the plurality of transistors is connected to the controlled circuit, the controlled circuit and the switch circuit are disposed in the semiconductor integrated circuit, and the plurality of transistors respectively have the current capabilities in such a way that a variation of a power supply potential generated in the controlled circuit at the time of the transition of the plurality of transistors to the non-conducted state is made substantially constant.

* * * * *